US012761547B2

(12) United States Patent
Hsu et al.

(10) Patent No.: US 12,761,547 B2
(45) Date of Patent: Oct. 13, 2026

(54) PELLICLE FOR EUV LITHOGRAPHY MASKS AND METHODS OF MANUFACTURING THEREOF

(71) Applicant: TAIWAN SEMICONDUCTOR MANUFACTURING COMPANY, LTD., Hsinchu (TW)

(72) Inventors: Pei-Cheng Hsu, Taipei (TW); Wei-Hao Lee, Taipei City (TW); Huan-Ling Lee, Hsinchu County (TW); Hsin-Chang Lee, Zhubei City (TW); Chin-Hsiang Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 532 days.

(21) Appl. No.: 18/133,945

(22) Filed: Apr. 12, 2023

(65) Prior Publication Data

US 2024/0094626 A1 Mar. 21, 2024

Related U.S. Application Data

(60) Provisional application No. 63/408,502, filed on Sep. 21, 2022.

(51) Int. Cl.
*G03F 1/62* (2012.01)
*B82Y 30/00* (2011.01)
*G03F 1/24* (2012.01)
*H10P 76/20* (2026.01)

(52) U.S. Cl.
CPC ................ *G03F 1/62* (2013.01); *B82Y 30/00* (2013.01); *H10P 76/2041* (2026.01); *G03F 1/24* (2013.01)

(58) Field of Classification Search
CPC ..... G03F 1/62; G03F 1/24; G03F 1/64; B82Y 30/00; H01L 21/0274; C01B 2202/02; C01B 2202/06; H10P 76/2041
USPC .............................................................. 430/5
See application file for complete search history.

(56) References Cited

U.S. PATENT DOCUMENTS

| | | | | |
|---|---|---|---|---|
| 5,958,605 | A | 9/1999 | Montcalm et al. | |
| 10,908,496 | B2 | 2/2021 | Nasalevich et al. | |
| 11,314,169 | B2 | 4/2022 | Lin | |
| 11,923,196 | B2 | 3/2024 | Lin et al. | |
| 2017/0038676 | A1* | 2/2017 | Jung ......................... | G03F 1/62 |
| 2021/0003929 | A1 | 1/2021 | Kim et al. | |
| 2021/0191255 | A1 | 6/2021 | Timmermans et al. | |
| 2022/0260932 | A1 | 8/2022 | Hsu et al. | |
| 2022/0276553 | A1 | 9/2022 | Nikipelov et al. | |
| 2023/0125257 | A1 | 4/2023 | Hulse et al. | |
| 2023/0341764 | A1 | 10/2023 | Lima et al. | |

(Continued)

FOREIGN PATENT DOCUMENTS

| | | | |
|---|---|---|---|
| CN | 109154771 | A | 1/2019 |
| CN | 114647156 | A | 6/2022 |
| DE | 102022100372 | A1 | 8/2022 |

(Continued)

*Primary Examiner* — Caleen O Sullivan
(74) *Attorney, Agent, or Firm* — STUDEBAKER BRACKETT PLLC

(57) ABSTRACT

A pellicle for an extreme ultraviolet (EUV) photomask includes a pellicle frame and a main membrane attached to the pellicle frame. The main membrane includes a plurality of nanotubes, and each of the plurality of nanotubes is covered by a coating layer containing Si and one or more metal elements.

20 Claims, 25 Drawing Sheets

(56) References Cited

U.S. PATENT DOCUMENTS

2025/0004362 A1* 1/2025 Agricola .................. G03F 1/62

FOREIGN PATENT DOCUMENTS

| | | | |
|---|---|---|---|
| KR | 10-2021-0053168 | A | 5/2021 |
| KR | 10-2278843 | B1 | 7/2021 |
| KR | 10-2022-0047581 | A | 4/2022 |
| KR | 10-2022-0115879 | A | 8/2022 |
| TW | 202216589 | A | 5/2022 |
| TW | 202236000 | A | 9/2022 |
| WO | 2021037662 | A1 | 3/2021 |

* cited by examiner

PELLICLE FOR EUV LITHOGRAPHY MASKS AND METHODS OF MANUFACTURING THEREOF

RELATED APPLICATIONS

This application claims priority of U.S. Provisional Patent Application No. 63/408,502 filed on Sep. 21, 2022, the entire contents of which are incorporated herein by reference.

BACKGROUND

A pellicle is a thin transparent film stretched over a frame that is glued over one side of a photo mask to protect the photo mask from damage, dust and/or moisture. In extreme ultraviolet (EUV) lithography, a pellicle having a high transparency in the EUV wavelength region, a high mechanical strength and low or no contamination is generally required. An EUV transmitting membrane is also used in an EUV lithography apparatus instead of a pellicle.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
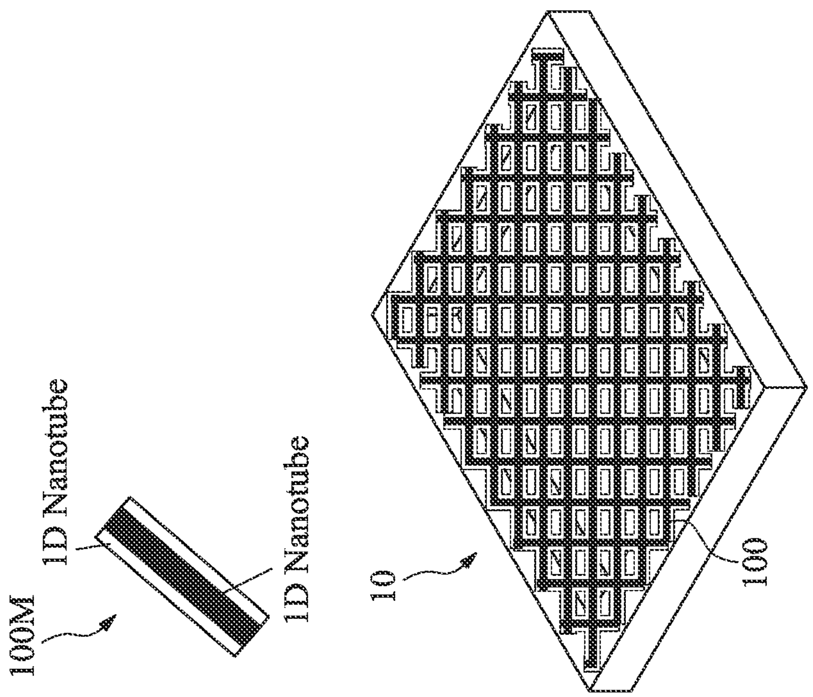
FIGS. 1A and 1B show pellicles for an EUV photo mask in accordance with embodiments of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in between the described operations, and the order of operations may be changed. In the present disclosure, the phrase "at least one of A, B and C" means either one of A, B, C, A+B, A+C, B+C or A+B+C, and does not mean one from A, one from B and one from C, unless otherwise explained. Materials, configurations, structures, operations and/or dimensions explained with one embodiment can be applied to other embodiments, and detained description thereof may be omitted.

EUV lithography is one of the crucial techniques for extending Moore's law. However, due to wavelength scaling from 193 nm (ArF) to 13.5 nm, the EUV light source suffers from strong power decay due to environmental adsorption. Even though a stepper/scanner chamber is operated under vacuum to prevent strong EUV adsorption by gas, maintaining a high EUV transmittance from the EUV light source to a wafer is still an important factor in EUV lithography.

A pellicle generally requires a high transparency and a low reflectivity. In UV or DUV lithography, the pellicle film is made of a transparent resin film. In EUV lithography, however, a resin based film would not be acceptable, and a non-organic material, such as a polysilicon, silicide or metal film, is used.

Carbon nanotubes (CNTs) are one of the materials suitable for a pellicle for an EUV reflective photo mask, because CNTs have a high EUV transmittance of more than 96.5%. Generally, a pellicle for an EUV reflective mask requires the following properties: (1) Long life time in a hydrogen radical rich operation environment in an EUV stepper/scanner; (2) Strong mechanical strength to minimize the sagging effect during vacuum pumping and venting operations; (3) A high or perfect blocking property for particles larger than about 20 nm (killer particles); and (4) A good heat dissipation to prevent the pellicle from being burnt out by EUV radiation. Other nanotubes made of a non-carbon based material are also usable for a pellicle for an EUV photo mask. In some embodiments of the present disclosure, a nanotube is a one dimensional elongated tube having a dimeter in a range from about 0.5 nm to about 100 nm.

In the present disclosure, a pellicle for an EUV photo mask includes a network membrane having a plurality of nanotubes covered by one or more cover layers. Further, a method of forming one or more cover layer over the nanotubes to increase mechanical and chemical strength is also disclosed.

Figure 1A:
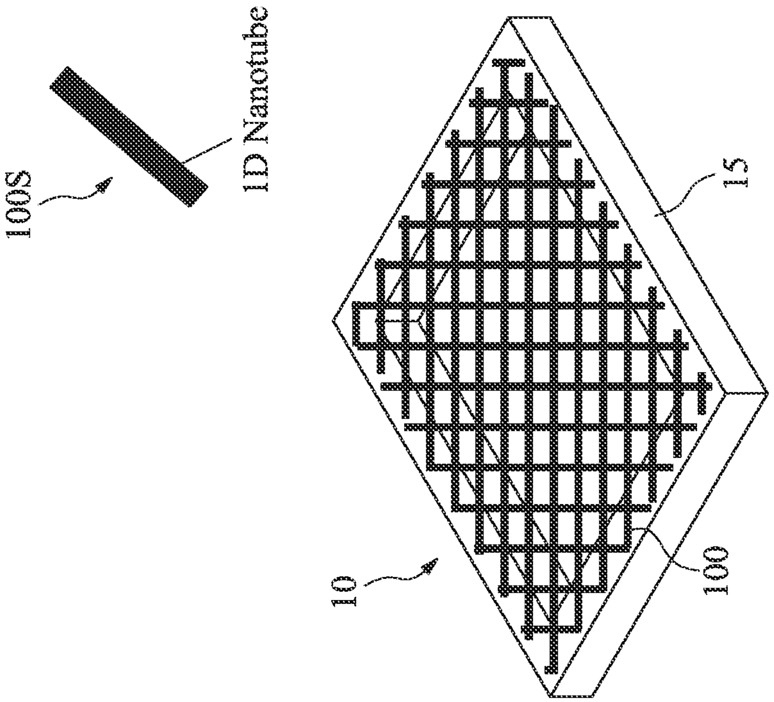

FIGS. 1A and 1B show EUV pellicles 10 in accordance with an embodiment of the present disclosure. In some embodiments, a pellicle 10 for an EUV reflective mask includes a main network membrane 100 disposed over and attached to a pellicle frame 15. In some embodiments, as shown in FIG. 1A, the main network membrane 100 includes a plurality of single wall nanotubes 100S, and in other embodiments, as shown in FIG. 1B, the main network membrane 100 includes a plurality of multiwall nanotubes 100M. In some embodiments, the single wall nanotubes are carbon nanotubes. In some embodiments, some of the single wall nanotubes form a bundle of nanotubes by being closely attached to each other.

In some embodiments, a multiwall nanotube is a co-axial nanotube having two or more tubes co-axially surrounding an inner tube(s). In some embodiments, the main network membrane 100 includes only one type of nanotube (single wall/multiwall, or material) and in other embodiments, different types of nanotubes form the main network membrane 100. In some embodiments, the multiwall nanotubes are multiwall carbon nanotubes. In some embodiments, some of the multiwall nanotubes form a bundle of nanotubes by being closely attached to each other.

In some embodiments, a pellicle (support) frame 15 is attached to the main network membrane 100 to maintain a space between the main network membrane of the pellicle and an EUV mask (pattern area) when mounted on the EUV mask. The pellicle frame 15 of the pellicle is attached to the surface of the EUV photo mask with an appropriate bonding material. In some embodiments, the bonding material is an adhesive, such as an acrylic or silicon based glue or an A-B cross link type glue. The size of the frame structure is larger than the area of the black borders of the EUV photo mask so that the pellicle covers not only the circuit pattern area of the photo mask but also the black borders.

FIGS. 2A, 2B, 2C and 2D show various views of multiwall nanotubes in accordance with embodiments of the present disclosure.

Figure 2C:
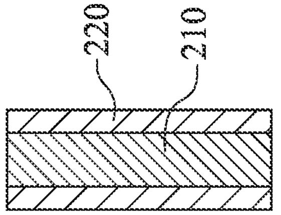
FIGS. 2A, 2B, 2C and 2D show various views of multi-wall nanotubes in accordance with embodiments of the present disclosure.
Figure 2B:
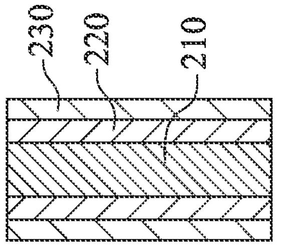
Figure 2D:
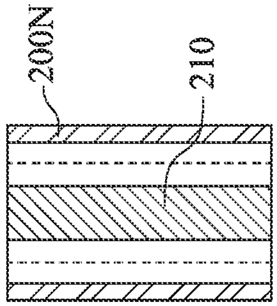
Figure 2A:
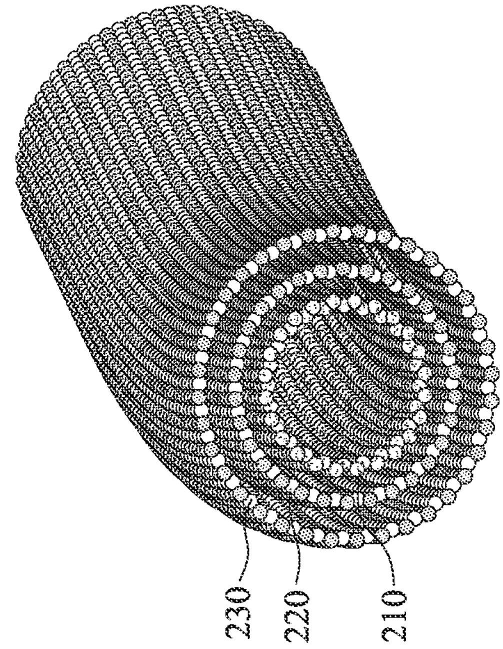

In some embodiments, the nanotubes in the main network membrane 100 include multiwall nanotubes, which are also referred to as co-axial nanotubes. FIG. 2A shows a perspective view of a multiwall co-axial nanotube having threes tubes 210, 220 and 230 and FIG. 2B shows a cross sectional view thereof. In some embodiments, the inner tube 210 and outer tubes 220 and 230 are carbon nanotubes. In other embodiments, one or more of the inner or two outer tubes are non-carbon based nanotubes, such as boron nitride nanotubes.

The number of tubes of the multiwall nanotubes is not limited to three. In some embodiments, the multiwall nanotube has two co-axial nanotubes as shown in FIG. 2C, and in other embodiments, the multiwall nanotube includes the innermost tube 210 and the first to N-th nanotubes including the outermost tube 200N, where N is a natural number from 1 to about 20, as shown in FIG. 2D. In some embodiments, N is up to 10 or up to 5. In some embodiments, at least one of the first to the N-th outer layers is a nanotube coaxially surrounding the innermost nanotube 210. In some embodiments, all the innermost tube 210 and the first to the N-th outer layers are carbon nanotubes. In other embodiments, one or more of the tubes are non-carbon based nanotubes.

In some embodiments, a diameter of the innermost nanotube is in a range from about 0.5 nm to about 20 nm and is in a range from about 1 nm to about 10 nm in other embodiments. In some embodiments, a diameter of the multiwall nanotubes (i.e., diameter of the outermost tube) is in a range from about 3 nm to about 40 nm and is in a range from about 5 nm to about 20 nm in other embodiments. In some embodiments, a length of the multiwall nanotube is in a range from about 0.5 μm to about 50 μm and is in a range from about 1.0 μm to about 20 μm in other embodiments.

Figure 3A:
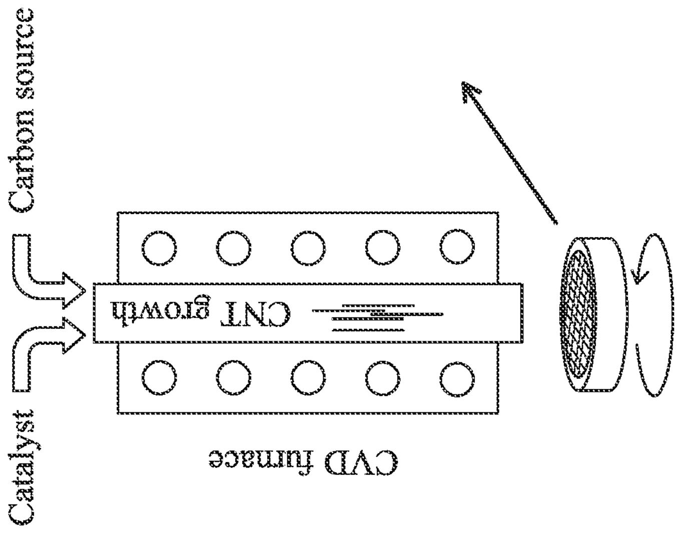
FIGS. 3A, 3B and 3C show a manufacturing process of a network membrane in accordance with an embodiment of the present disclosure.
Figure 3B:
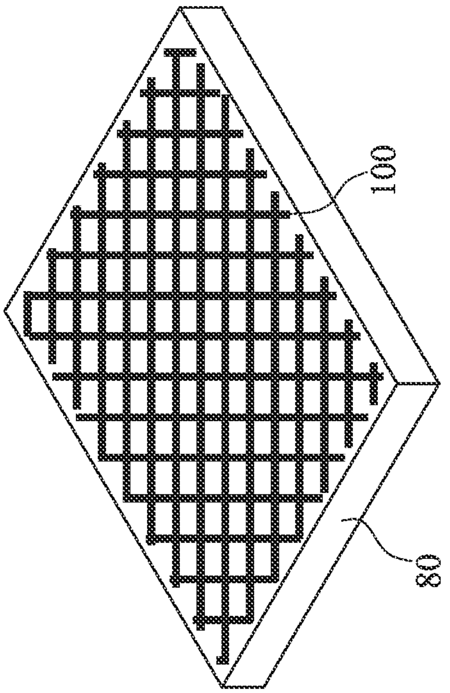
Figure 3C:
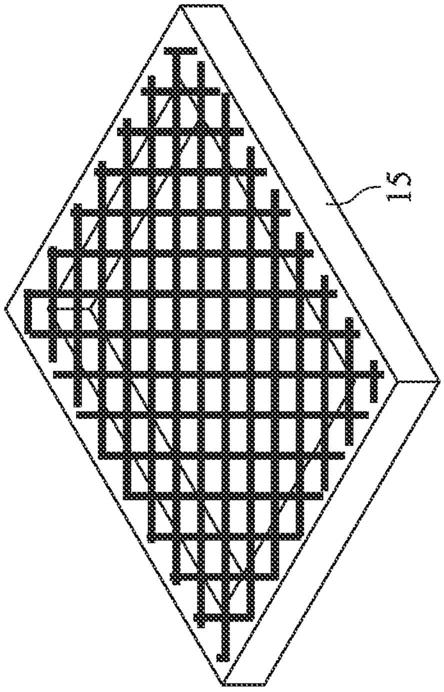

FIGS. 3A, 3B and 3C show the manufacturing of nanotube network membranes for a pellicle in accordance with embodiments of the present disclosure.

In some embodiments, carbon nanotubes are formed by a chemical vapor deposition (CVD) process. In some embodiments, a CVD process is performed by using a vertical furnace as shown in FIG. 3A, and synthesized nanotubes are deposited on a support membrane 80 as shown in FIG. 3B. In some embodiments, carbon nanotubes are formed from a carbon source gas (precursor) using an appropriate catalyst, such as Fe or Ni. Then, the network membrane 100 formed over the support membrane 80 is detached from the support membrane 80, and transferred on to the pellicle frame 15 as shown in FIG. 3C. In some embodiments, a stage or a susceptor, on which the support membrane 80 is disposed, rotates continuously or intermittently (step-by-step manner) so that the synthesized nanotubes are deposited on the support membrane 80 with different or random directions.

Figure 3D:
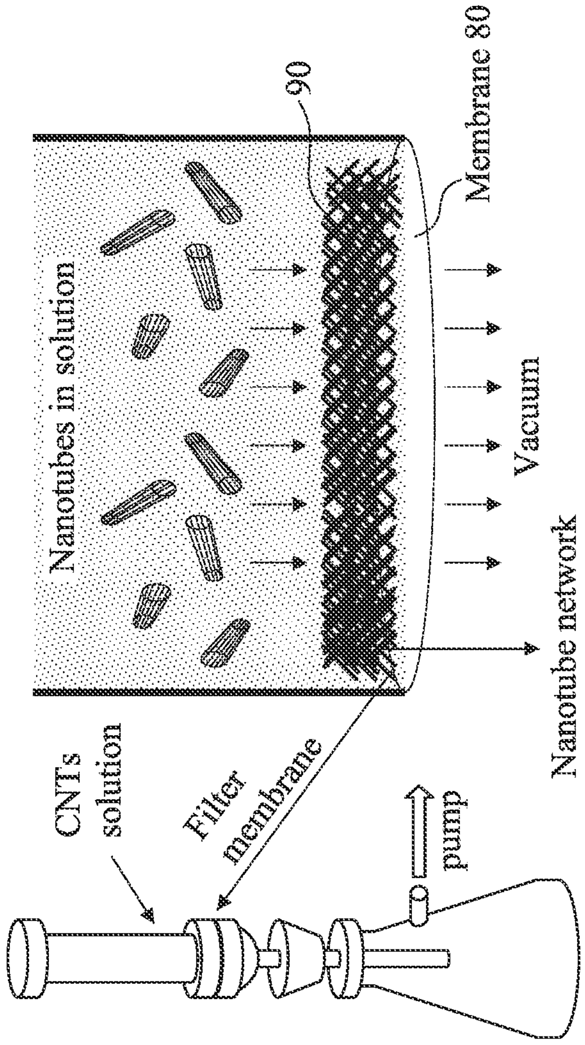
FIG. 3D shows a manufacturing process of a network membrane.
Figure 3E:
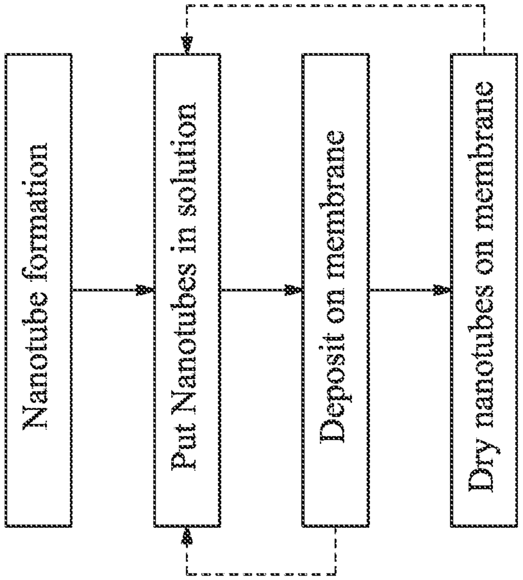
FIG. 3E shows a flow chart thereof in accordance with an embodiment of the present disclosure.

FIG. 3D shows a manufacturing process of a network membrane and FIG. 3E shows a flow chart thereof in accordance with an embodiment of the present disclosure.

In some embodiments, carbon nanotubes are dispersed in a solution as shown in FIG. 3D. The solution includes a solvent, such as water or an organic solvent, and optionally a surfactant, such as sodium dodecyl sulfate (SDS). The nanotubes are one type or two or more types of nanotubes (material and/or wall numbers). In some embodiments, carbon nanotubes are formed by various methods, such as arc-discharge, laser ablation or chemical vapor deposition (CVD) methods.

As shown in FIG. 3D, a support membrane 80 is placed between a chamber or a cylinder in which the nanotube dispersed solution is disposed and a vacuum chamber. In some embodiments, the support membrane is an organic or inorganic porous or mesh material. In some embodiments, the support membrane is a woven or non-woven fabric. In some embodiments, the support membrane has a circular shape in which a pellicle size of a 150 mm×150 mm square (the size of an EUV mask) can be placed.

As shown in FIG. 3D, the pressure in the vacuum chamber is reduced so that a pressure is applied to the solvent in the chamber or cylinder. Since the mesh or pore size of the support membrane is sufficiently smaller than the size of the nanotubes, the nanotubes are captured by the support membrane while the solvent passes through the support membrane. The support membrane on which the nanotubes are deposited is detached from the filtration apparatus of FIG. 3D and then is dried. In some embodiments, the deposition by filtration is repeated so as to obtain a desired thickness of the nanotube network layer as shown in FIG. 3E. In some embodiments, after the deposition of the nanotubes in the solution, other nanotubes are dispersed in the same or new solution and the filter-deposition is repeated. In other embodiments, after the nanotubes are dried, another filter-deposition is performed. In the repetition, the same type of nanotubes is used in some embodiments, and different types of nanotubes are used in other embodiments. In some embodiments, the nanotubes dispersed in the solution include multiwall nanotubes.

FIGS. 4A and 4B to 6A and 6B show cross sectional views (the "A" figures) and plan (top) views (the "B" figures) of the various stages for manufacturing a pellicle for an EUV photo mask in accordance with an embodiment of the present disclosure. It is understood that additional operations can be provided before, during, and after the processes shown by FIGS. 4A-6B, and some of the operations described below can be replaced or eliminated, for additional embodiments of the method. The order of the operations/processes may be interchangeable. Materials, configurations, methods, processes and/or dimensions as explained with respect to the foregoing embodiments are applicable to the following embodiments, and the detailed description thereof may be omitted.

Figure 4A:
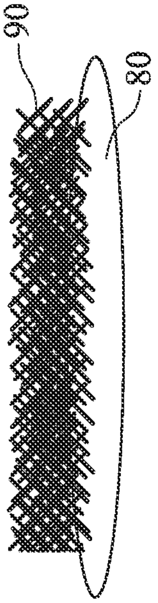
FIGS. 4A and 4B show a cross sectional view and a plan (top) view of one of the various stages for manufacturing a pellicle for an EUV photo mask in accordance with an embodiment of the present disclosure.
Figure 4B:
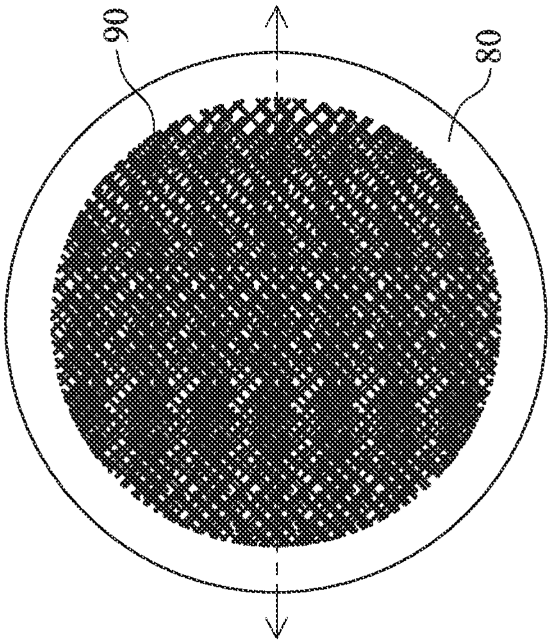

As shown in FIGS. 4A and 4B, a nanotube layer 90 is formed on a support membrane 80 by one or more method as explained above. In some embodiments, the nanotube layer 90 includes single wall nanotubes, multi wall nanotubes, or mixtures thereof. In some embodiments, the nanotube layer 90 includes single wall nanotubes only. In some embodiments, the nanotubes are carbon nanotubes.

Figure 5A:
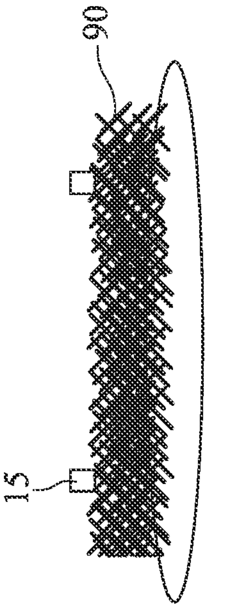
FIGS. 5A and 5B show a cross sectional view and a plan (top) view of one of the various stages for manufacturing a pellicle for an EUV photo mask in accordance with an embodiment of the present disclosure.
Figure 5B:
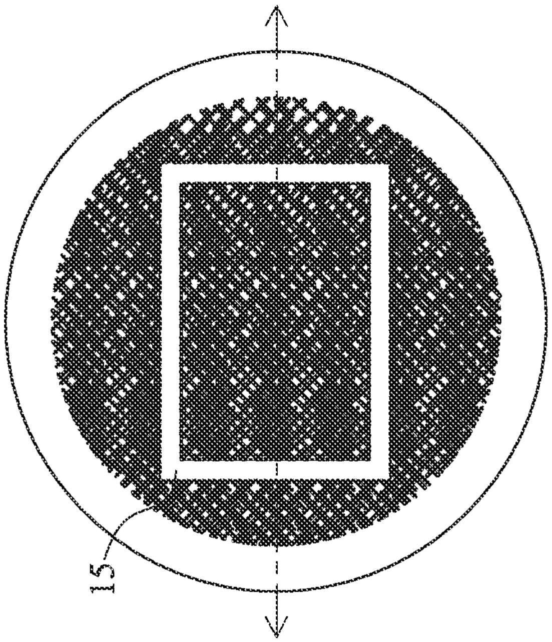

Then, as shown in FIGS. 5A and 5B, a pellicle frame 15 is attached to the nanotube layer 90. In some embodiments, the pellicle frame 15 is formed of one or more layers of crystalline silicon, polysilicon, silicon oxide, silicon nitride, ceramic, metal or organic material. In some embodiments, as shown in FIG. 5B, the pellicle frame 15 has a rectangular (including square) frame shape, which is larger than the black border area of an EUV mask and smaller than the substrate of the EUV mask.

Figure 6A:
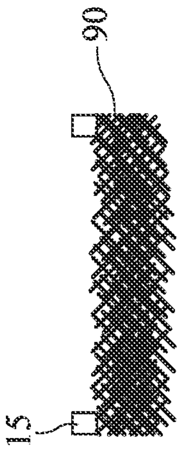
FIGS. 6A and 6B show a cross sectional view and a plan (top) view of one of the various stages for manufacturing a pellicle for an EUV photo mask in accordance with an embodiment of the present disclosure.
Figure 6B:
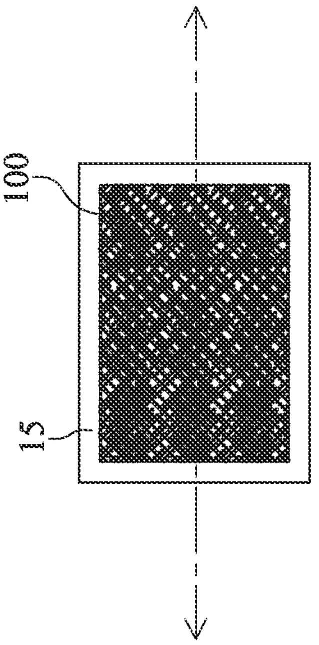

Next, as shown in FIGS. 6A and 6B, the nanotube layer 90 and the support membrane 80 are cut into a rectangular shape having the same size as or slightly larger than the pellicle frame 15, and then the support membrane 80 is detached or removed, in some embodiments. When the support membrane 80 is made of an organic material, the support membrane 80 is removed by wet etching using an organic solvent.

In some embodiments of the present disclosure, a nanotube in a pellicle membrane is coated with one or more coating layers.

Figure 7A:
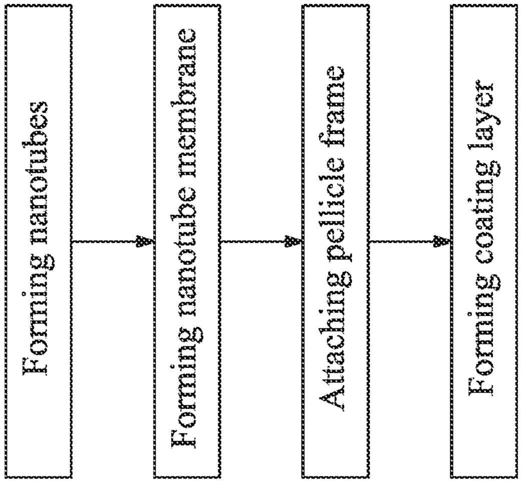
FIGS. 7A and 7B show flow charts for manufacturing a pellicle for an EUV photo mask in accordance with embodiments of the present disclosure.
Figure 7B:
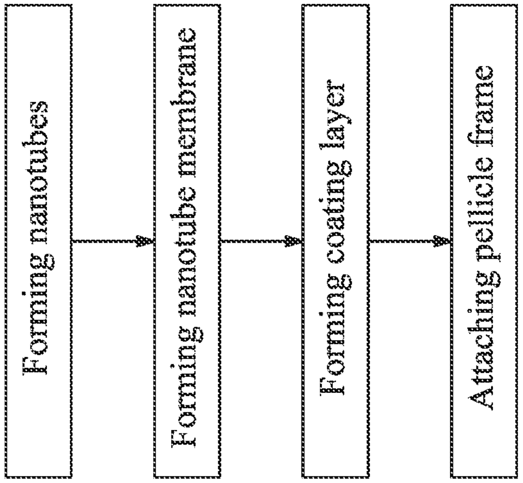

FIGS. 7A and 7B are flow charts showing a method of manufacturing a pellicle according to embodiments of the present disclosure. It is understood that additional operations can be provided before, during, and after the processes shown in FIGS. 7A and 7B, and some of the operations described below can be replaced or eliminated for additional embodiments of the method. The order of the operations/processes may be interchangeable.

In the flow of FIG. 7A, as the processes described above, nanotubes are formed, and a membrane is formed by the nanotubes. Then, as set forth, a pellicle frame is attached to the membrane. Subsequently, one or more coating layers are formed over each of the nanotubes. In the flow shown in FIG. 7B, before the pellicle frame is attached to the membrane, one or more coating layers are formed over each of the nanotubes.

Figure 8A:
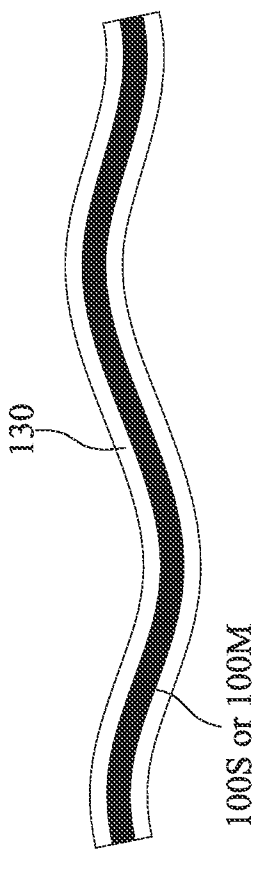
FIGS. 8A and 8B show various views of a nanotube coated with one or more coating layers in accordance with embodiments of the present disclosure.

In some embodiments, a first coating layer 130 is formed over a single wall nanotube 100S or a multiwall nanotube 100M as shown in FIG. 8A. In some embodiments, the nanotube is a single wall carbon nanotube or a multiwall carbon nanotube.

In some embodiments, the first coating layer 130 contains silicon and one or more metal elements, for example, transition metal elements. In some embodiments, the first coating layer is made of silicide. In some embodiments, the first coating layer 130 is a silicide of one or more of Zr, Ti, Mn, Fe, Ru, Ni, Pd, Co, Mo, Nb, Ir or Rh (i.e., MSi, where M is one or more of Zr, Ti, Mn, Fe, Ru, Ni, Pd, Co, Mo, Nb, Jr or Rh). When an EUV transmittance of the nanotube membrane is about 97%, the nanotube membrane with silicide coated nanotubes has more than about 90% EUV transmittance with a coating layer thickness of 10 nm. In some embodiments, when the metal elements are Zr, Nb or Mo, the nanotube membrane with silicide coated nanotubes has more than about 93% EUV transmittance at a coating layer thickness of 10 nm. The coating layer can prevent the carbon nanotubes from being damaged by, for example, hydrogen gas and/or EUV radiation.

In some embodiments, a thickness of the first coating layer 130 is in a range from 2-about 2 nm to about 20 nm and is in a range from about 3 nm to about 10 nm in other embodiments. In some embodiments, the thickness of the first coating layer 130 is not uniform. The first coating layer 130 is formed by chemical vapor deposition (CVD), physical vapor deposition (PVD), atomic layer deposition (ALD) or any other suitable film formation methods.

In some embodiments, a thickness of the first coating layer 130 is in a range from 2 about nm to about 20 nm and is in a range from about 3 nm to about 10 nm in other embodiments. In some embodiments, the thickness of the first coating layer 130 is not uniform. The first coating layer 130 is formed by chemical vapor deposition (CVD), physical vapor deposition (PVD), atomic layer deposition (ALD) or any other suitable film formation methods.

Figure 8B:
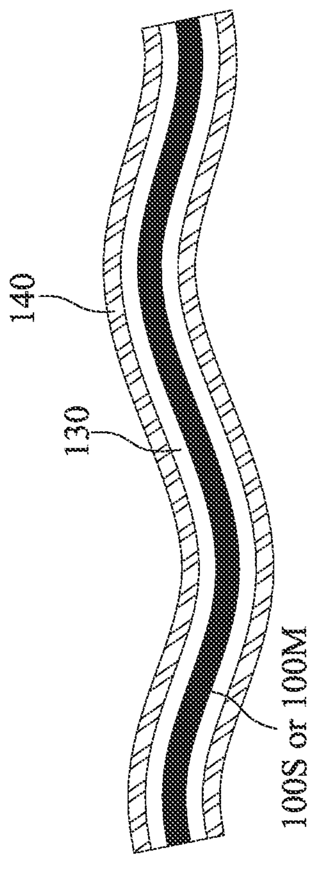

In some embodiments, a second coating layer 140 is formed over the first coating layer 130 as shown in FIG. 8B. The second coating layer 140 is made of a material having a lower oxidation rate than the first coating layer 130 or has an ability to prevent the first coating layer from oxidation. In some embodiments, the second coating layer 140 includes one of AlN, TiN or SiC. In some embodiments, a thickness of the second coating layer 140 is in a range from about 2 nm to about 10 nm and is in a range from about 3 nm to about 6 nm in other embodiments. In some embodiments, a thickness of the second coating layer 140 is not uniform. The second coating layer 140 is formed by CVD, PVD, ALD or any other suitable film formation methods.

Figure 9A:
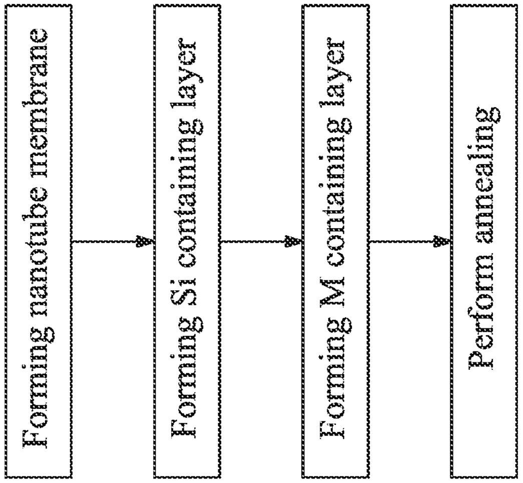
FIGS. 9A and 9B show flow charts for manufacturing a pellicle for an EUV photo mask in accordance with embodiments of the present disclosure.
Figure 9B:
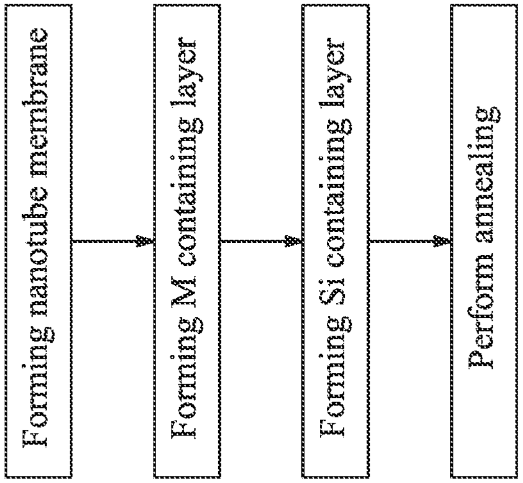

FIGS. 9A and 9B are flow charts showing a method of forming a first coating layer according to embodiments of the present disclosure. FIGS. 10A-10C and FIGS. 11A-11C also show the method of forming one or more coating layers according to embodiments of the present disclosure, corresponding to FIGS. 9A and 9B, respectively. It is understood that additional operations can be provided before, during, and after the processes shown in FIGS. 9A and 9B, 10A-10C and 11A-11C, and some of the operations described below can be replaced or eliminated, for additional embodiments of the method. The order of the operations/processes may be interchangeable.

Figure 10C:
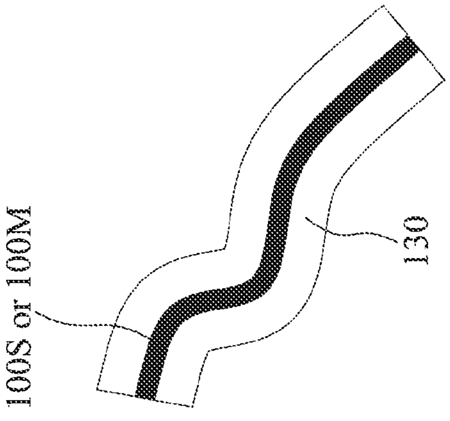
FIGS. 10A, 10B and 10C show various stages of manufacturing a pellicle for an EUV photo mask in accordance with embodiments of the present disclosure.
Figure 10B:
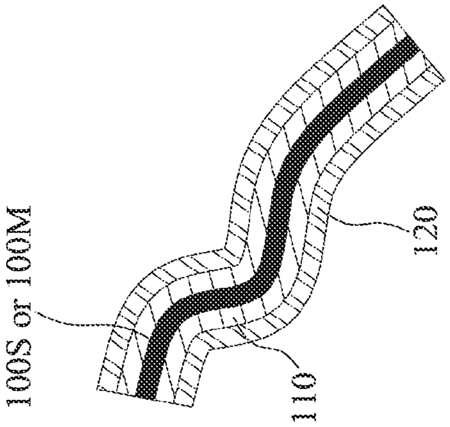
Figure 10A:
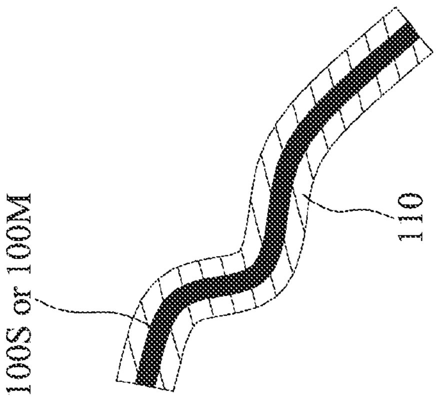

In some embodiments, as shown in FIG. 9A and FIG. 10A, after a nanotube membrane is formed, a silicon containing layer 110 is formed over the nanotubes in the nanotube membrane. In some embodiments, the silicon containing layer 110 is amorphous or polycrystalline silicon or silicon nitride, formed by CVD, ALD, or PVD. Then, as shown in FIG. 10B, a metal M containing layer 120 is formed over the Si containing layer 110. In some embodiments, the metal containing layer is a metal layer of element M or a metal nitride layer of element M. Then, as shown in FIG. 10C, an annealing (heating) operation is performed to form a silicide or silicide-nitride layer 130 by reacting Si in the Si containing layer 110 and the metal M in the metal containing layer 120.

Figure 11A:
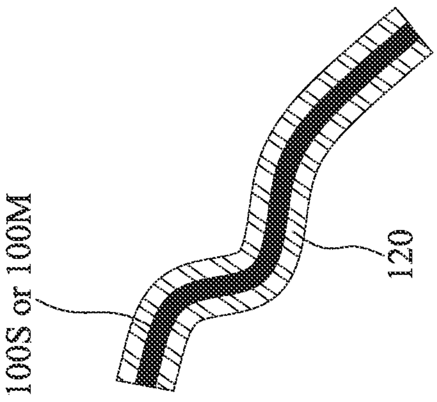
FIGS. 11A, 11B and 11C show various stages of manufacturing a pellicle for an EUV photo mask in accordance with embodiments of the present disclosure.
Figure 11B:
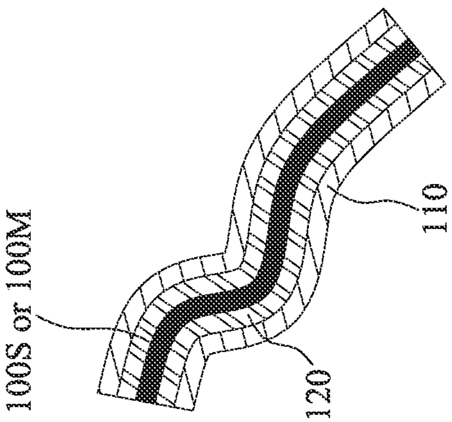
Figure 11C:
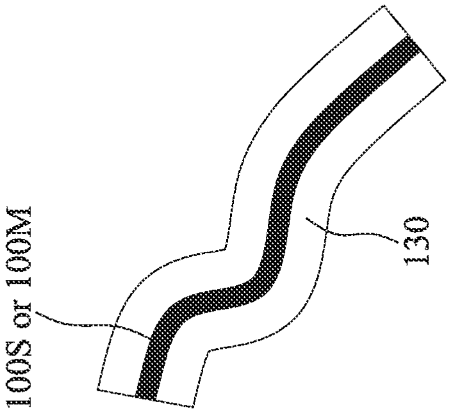

In some embodiments, as shown in FIG. 9B and FIG. 11A, after a nanotube membrane is formed, a metal M containing layer 120 is formed over the nanotubes in the nanotube membrane. Then, as shown in FIG. 11B, a Si containing layer 110 is formed over the metal containing layer 120. Then, as shown in FIG. 11C, an annealing (heating) operation is performed to form a silicide or silicide-nitride layer 130 by reacting Si in the Si containing layer 110 and the metal M in the metal containing layer 120.

In some embodiments, the annealing operation is performed at a temperature in a range from 200° C. to 1000° C. and at a temperature in a range from 500° C. to 800° C. in other embodiments. In some embodiments, the annealing operation is performed for 5 min to 60 min and for 10 min to 30 min in other embodiments. The apparatus and method of the annealing operation are explained below.

Figure 12A:
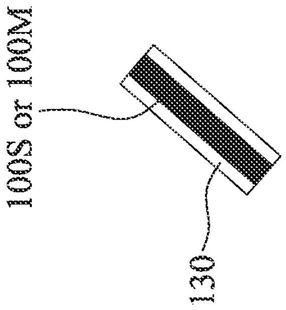
FIGS. 12A, 12B and 12C show various views of nanotubes with a coating layer in accordance with embodiments of the present disclosure.
Figure 12B:
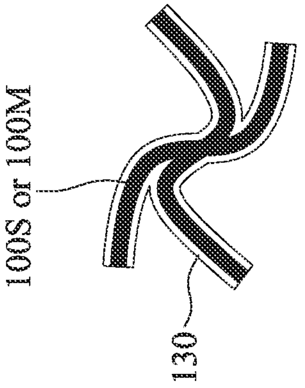
Figure 12C:
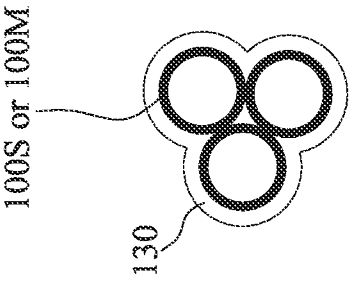

FIGS. 12A-12C show schematic views of a nanotube with a first coating layer 130. In some embodiments, the nanotube is a single wall nanotube 100S or a multiwall nanotube 100M. In some embodiments, at least a part of the nanotube is separated from other nanotubes and the first coating layer 130 fully wraps around the nanotube. In some embodiments, two or more nanotubes touch each other before the first coating layer 130 is formed, and thus as shown in FIG. 12B, the first coating layer 130 wraps around the nanotubes expect for the contact portion. In some embodiments, two or more nanotubes form a bundle of nanotubes by being closely attached to each other before the first coating layer 130 is formed. As shown in FIG. 12C, which is a cross sectional view cutting the bundle of nanotubes, the first coating layer 130 covers outer surface of the bundle. In some embodiments, a part of the nanotubes in the bundle is not covered by the first coating layer.

Figure 13A:
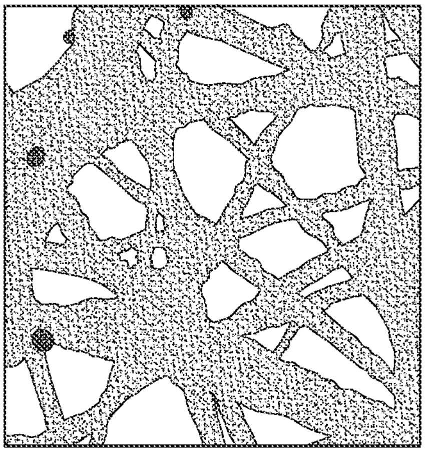
FIGS. 13A, 13B and 13C show various views of nanotubes with a coating layer in accordance with embodiments of the present disclosure.
Figure 13B:
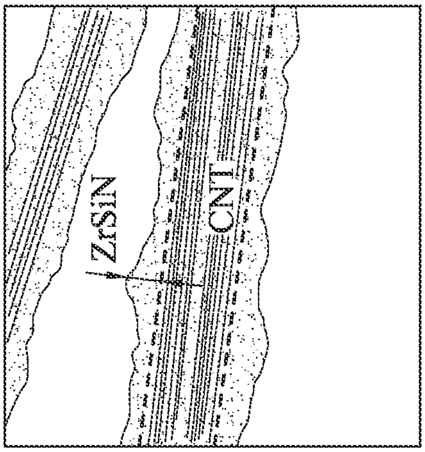
Figure 13C:
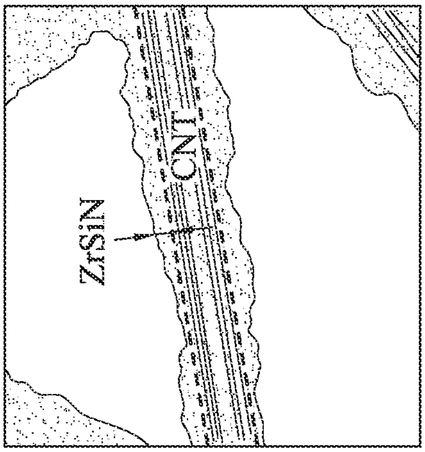

FIGS. 13A-13C show schematic views of a nanotube membrane with a first coating layer 130. As shown in FIGS. 13B and 13C, the first coating layer 130, for example ZrSi layer, is formed around the carbon nanotube CNT. In some embodiments, the thickness of the first coating layer 130 is not uniform.

In some embodiments, the annealing operation includes a Joule heating treatment, in which a current is applied to pass through the membrane to generate heat, using a Joule heating apparatus as described below.

Figure 14A:
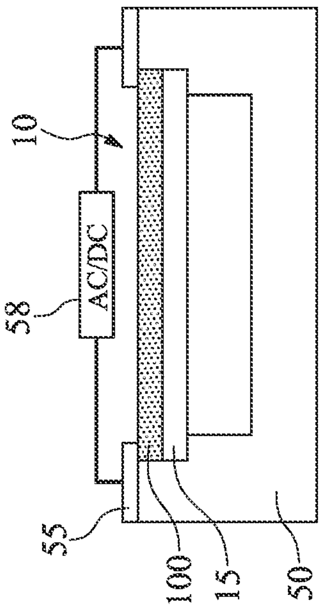
FIGS. 14A, 14B, 14C, 14D, 14E and 14F show various views of a Joule heating apparatus and process for a pellicle or a pellicle membrane in accordance with embodiments of the present disclosure.
Figure 14B:
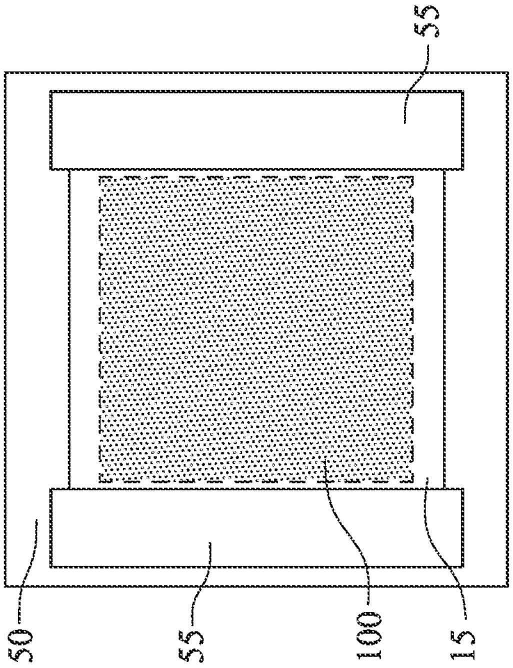

FIGS. 14A-14F show various views of a Joule heating apparatus and process for a pellicle or a pellicle membrane. FIGS. 14A, 14C, 14D, 14E and 14F are cross sectional views and FIG. 14B is a plan view (top view).

In some embodiments, as shown in FIGS. 14A and 14B, a pellicle 10 including the membrane 100 with the Si containing layer and the metal containing layer and frame 15 is placed over an insulating stage or support 50 and is clamped at the edge portions of the pellicle by parts of the stage and electrodes 55. The insulating stage 50 is made of ceramic in some embodiments, and the electrodes 55 are made of metal, such as tungsten, copper or steel. The electrodes 55 are attached to contact the membrane 100. In some embodiments, the electrodes 55 are attached to two side portions (e.g., left and right) of the membrane 100. In some embodiments, the length of the electrodes are greater than the length of the sides of the main membrane 100 (pellicle frame 15). In some embodiments, the main membrane 100 is horizontally supported. In some embodiments, the electrodes 55 are connected to a current source (power supply) 58 by wires.

Figure 14C:
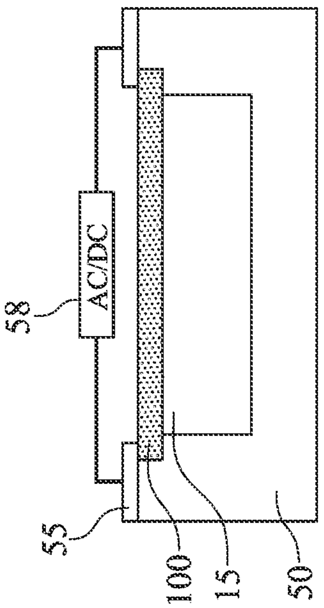
Figure 14D:
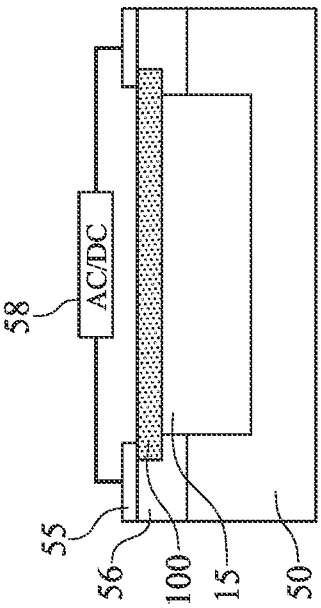

In other embodiments, as shown in FIG. 14C, when the membrane 100 with the Si containing layer and the metal containing layer and without a frame 15 is heated, the Joule heating apparatus clamps the membrane at the edge portions, and the electrodes 55 contacts the membrane 100. In some embodiments, as shown in FIG. 14D, the membrane 100 is clamped by two electrodes 55 and 56.

Figure 14E:
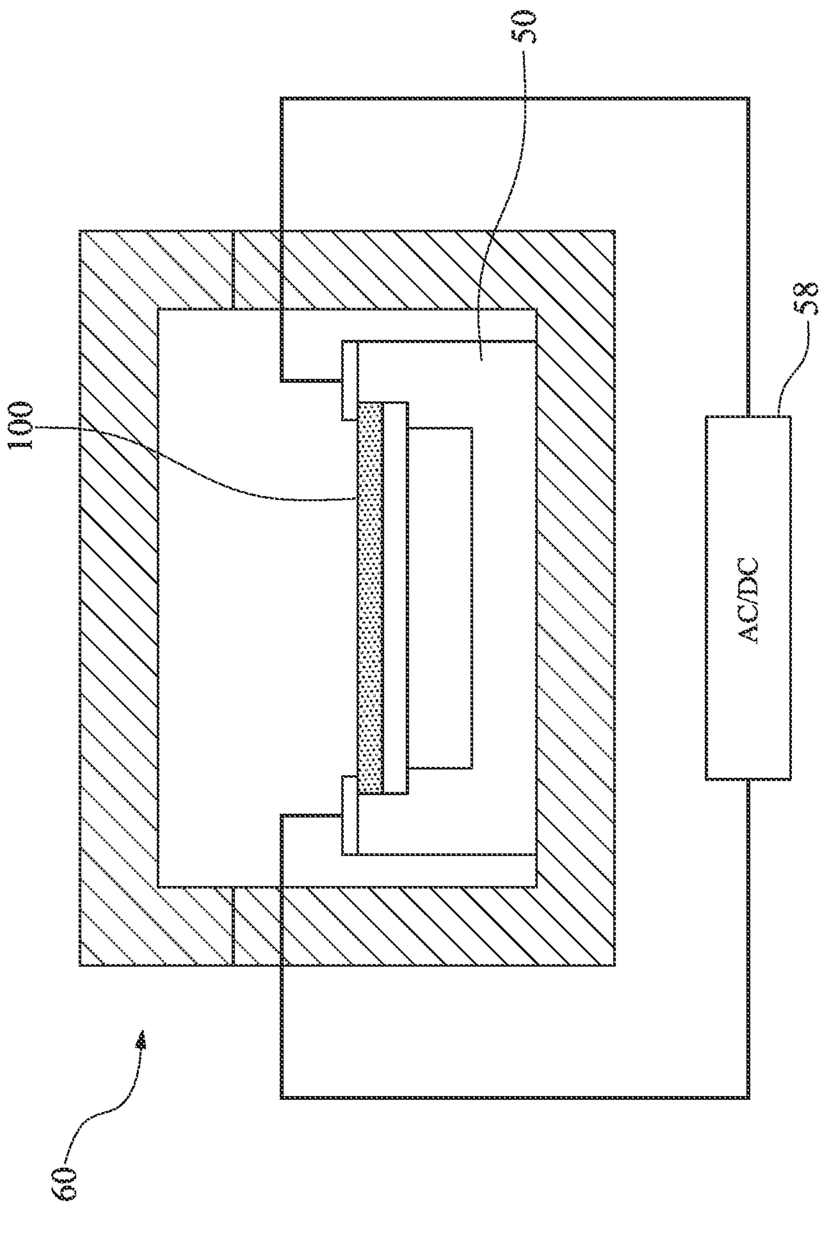

The Joule heating apparatus on which the pellicle 10 or the membrane 100 is mounted is placed in a vacuum chamber 60 as shown in FIG. 14E. In some embodiments, the vacuum chamber 60 includes a bottom part in which the Joule heating apparatus is placed and an upper (lid) part, and a gasket (e.g., O-ring) is disposed between the bottom part and the upper part. The wires of the Joule heating apparatus are connected to outside wires, which are connected to the power supply 58.

In the Joule heating operation, the vacuum chamber is evacuated to a pressure equal to or lower than 0.01 Torr in some embodiments. In some embodiments, the pressure is in a range from about $1\times10^{-7}$ Torr to about $1\times10^{-2}$ Torr. The power supply 58 applies current to the membrane 100 so that the current passes through the membrane generating heat. In some embodiments, the current is DC, and in other embodiments, the current is AC or pulse current.

In some embodiments, the current from the power supply 58 is adjusted such that the membrane is heated at a temperature in a range from about 200° C. to 1000° C. In some embodiments, the temperature is in a range from about 500° C. to about 800° C. In some embodiments, the pellicle frame 15 is made of ceramic or a metal or metallic material having a higher electric resistance than the carbon nanotube membrane 100.

In some embodiments, the Joule heating treatment is performed in an inert gas ambient, such as $N_2$ and/or Ar (and free from oxidizing gas). In some embodiments, the Joule heating is performed in an ambient containing $NH_3$. In some embodiments, the Joule heating treatment is performed for about five seconds to about 60 minutes, and is performed for about 30 seconds to about 15 minutes in other embodiments. When the heating time is shorter than these ranges, the silicide layer may not be fully formed, and when the heating time is longer than these ranges, a cycle time or a process efficiency may be degraded and the pellicle may be damaged.

In some embodiments, as shown in FIG. 14B, the electrodes 55 contact two sides (left and right) of the pellicle 10 and the current flows through the membrane 100. In other embodiments, after the heat treatment with the electrodes 55 contacting the two sides (left and right), the pellicle 10 or membrane 100 is rotated by 90 degrees so that the electrodes 55 contact other two sides (top and bottom) of the pellicle for the current to flow through the membrane 100 in the different directions. In some embodiments, an additional pair of electrodes are provided so that top and bottom edges of the pellicle 10 or membrane 100 are also clamped, and a current is switched to flow between the first pair of electrodes or the second (additional) pair of electrodes.

Figure 14F:
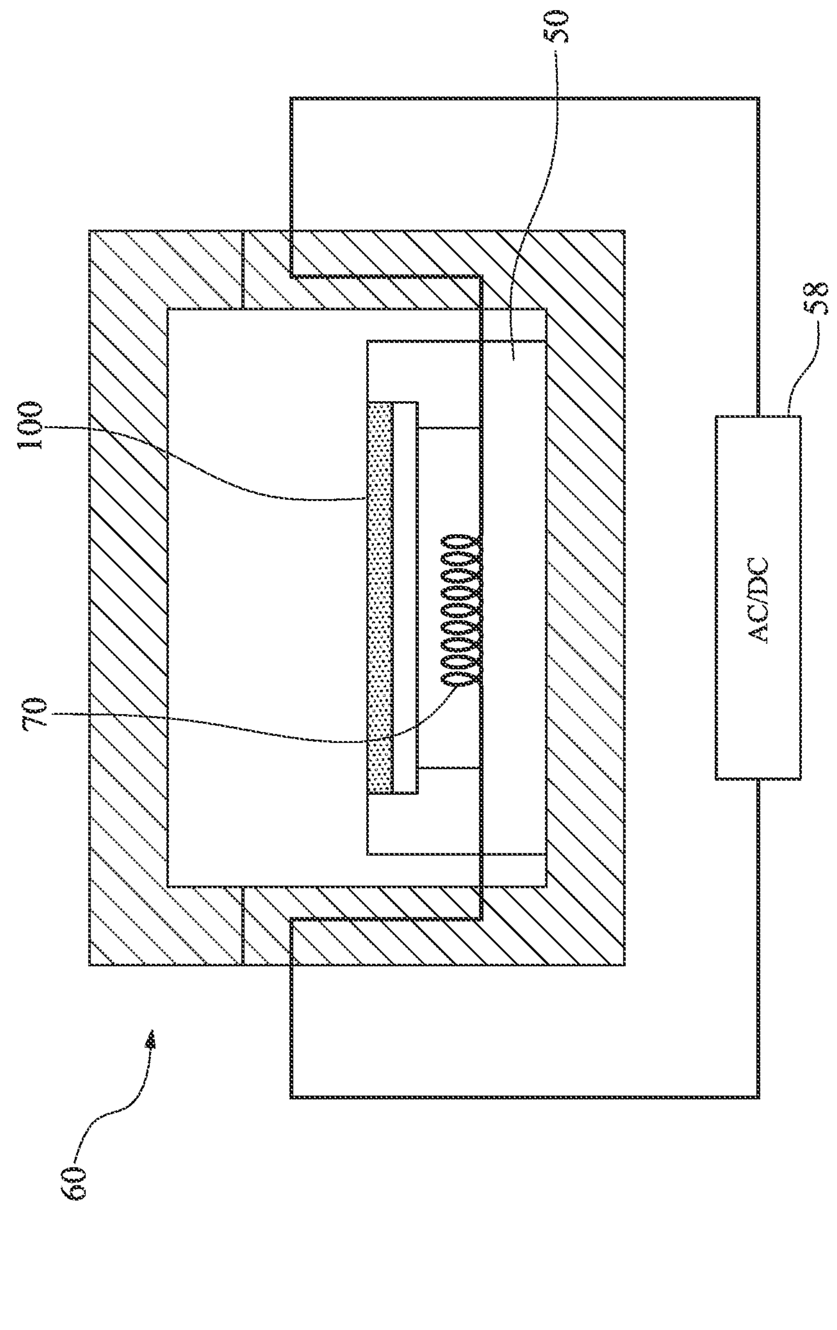

In some embodiments, a Joule heating process is performed using induction heating as shown in FIG. 14F. In some embodiments, one or more coils 70 are provided around (e.g., below) the pellicle 10 or membrane 100, and an alternating current is provided to the coils. In some embodiments, the coil is provided outside the vacuum chamber to surround the vacuum chamber. The vacuum chamber is made of glass or ceramic in some embodiments.

Figure 15A:
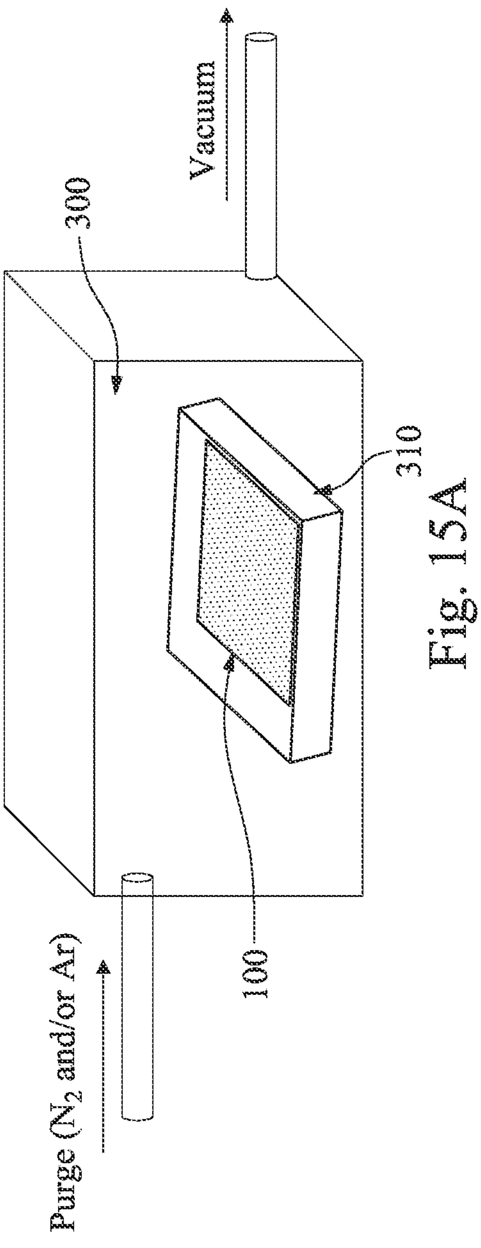
FIGS. 15A and 15B show schematic views illustrating an annealing apparatus and process for a pellicle or pellicle membrane according to embodiments of the present disclosure.
Figure 15B:
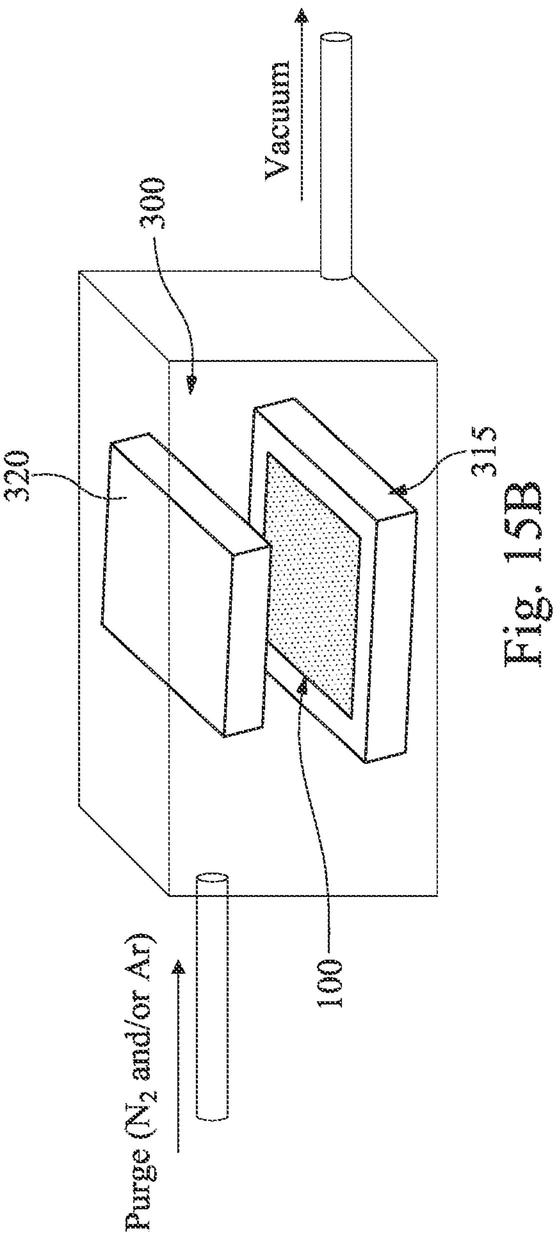

In some embodiments, the annealing operation includes a plate baking operation, or a lamp annealing operation, as described below. FIGS. 15A and 15B show schematic views illustrating an annealing apparatus and process for a pellicle or pellicle membrane according to embodiments of the present disclosure.

As shown in FIG. 15A, in some embodiments, the annealing apparatus includes a chamber 300, in which a hot plate 310 is placed. The nanotube membrane 100 with a Si containing layer and a metal containing layer is placed on the hot plate 310. In some embodiments, the chamber 300 is configured to be evacuated by one or more vacuum pumps. In some embodiments, one or more gas inlets are provided to the chamber to supply one or more gases, such as $N_2$ and/or Ar (and free from oxidizing gas). In some embodiments, the gas includes $NH_3$. In some embodiments, as shown in FIG. 15B, an infrared (IR) lamp 320 is used to heat the membrane 100 placed on a susceptor 315. In some embodiments, the susceptor 315 is a hot plate.

Figure 16:
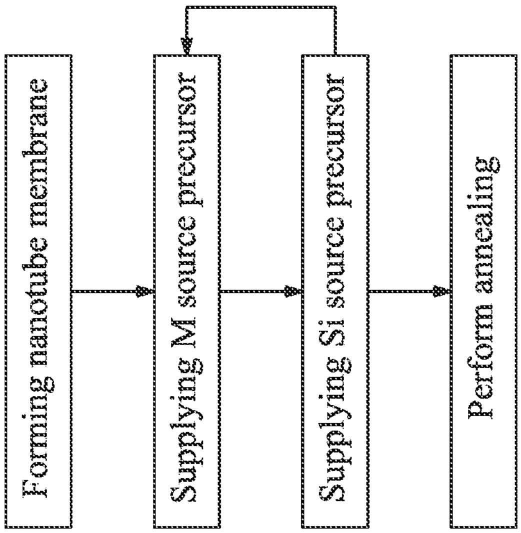
FIG. 16 is a flow chart for treating a pellicle for an EUV photo mask in accordance with an embodiment of the present disclosure.

FIG. 16 shows a flow chart showing a method of forming a first coating layer according to embodiments of the present disclosure. It is understood that additional operations can be provided before, during, and after the processes shown in FIG. 16, and some of the operations described below can be replaced or eliminated, for additional embodiments of the method. The order of the operations/processes may be interchangeable.

In some embodiments, the first coating layer 130 is formed by using ALD with a Si precursor and a metal M precursor. In some embodiments, the Si and/or metal precursor includes an organic Si or metal compound and/or a metal or Si chloride. In some embodiments, the metal is Zr, and thus in the ALD operation, a Zr containing precursor and a Si containing precursor are alternately supplied to the nanotube membrane.

In some embodiments, the Zr containing precursor is zirconium tetra-tert-butoxide ($Zr[OC(CH_3)_3]_4$) (zirconium tetra-tert-butoxide (ZTB)) or $ZrCl_4$. In some embodiments, the Si containing precursor is $SiCl_4$ or tetra butyl orthosilicate (tetra butoxysilane (TB OS)).

In some embodiments, $ZrCl_4$ and TBOS are used in the ALD to form $ZrSi_2$ or silicate. In some embodiments, the membrane is heated at a temperature in a range from about 300° C. to about 500° C. In some embodiments, a bubbling temperature of $ZrCl_4$ is in a range from about 140° C. to about 180° C. (e.g., 160° C.) and a bubbling temperature of TBOS is in a range from about 90° C. to about 100° C. (e.g., 95° C.). In some embodiments, a vapor pressure of $ZrCl_4$ is set at about 0.10 Torr to about 0.20 Torr (e.g., 0.15 Torr), and a vapor pressure of TBOS is set at about 1.0 Torr to about 1.2 Torr (e.g., 1.1 Torr). The deposition pressure is about 0.2 Torr to about 5 Torr (e.g., 1 Torr) in some embodiments. In some embodiments, a carrier gas is Ar with a flow rate of about 15 sccm to about 25 sccm (e.g., 20 sccm). In some embodiments, the precursors are supplied as gas pulses with a pulse time of about 0.01 sec to about 5 sec, with a purge time of about 1 sec to about 30 sec. In some embodiments, a purge gas is Ar with a flow rate of about 400 sccm to about 600 sccm (e.g., 500 sccm). In some embodiments, the pulse time of $ZrCl_4$ (e.g., 5 sec±10%) is longer than the pulse time of TBOS (e.g., 2 sec±10%). Each gas pulse is supplied twice or more (up to 10 times) in some embodiments.

In some embodiments, $SiCl_4$ and ZTB are used in the ALD to form $ZrSi_2$ or silicate. In some embodiments, the membrane is heated at a temperature in a range from about 125° C. to about 225° C. In some embodiments, a bubbling temperature of $SiCl_4$ is in a range from about −10° C. to about 25° C. (e.g., 0° C.) and a bubbling temperature of ZTB is in a range from about 25° C. to about 80° C. (e.g., 50° C.). In some embodiments, a vapor pressure of $SiCl_4$ is set at about 60 Torr to about 90 Torr (e.g., 77 Torr), and a vapor pressure of ZTB is set at about 0.3 Torr to about 0.6 Torr (e.g., 0.44 Torr). The deposition pressure is about 0.2 Torr to about 5 Torr (e.g., 1 Torr) in some embodiments. In some embodiments, a carrier gas is Ar with a flow rate of about 5 sccm to about 15 sccm (e.g., 10 sccm). In some embodiments, the precursors are supplied as gas pulses with a pulse time of about 0.01 sec to about 5 sec, with a purge time of about 1 sec to about 30 sec. In some embodiments, a purge gas is Ar with a flow rate of about 400 sccm to about 600 sccm (e.g., 500 sccm). In some embodiments, the pulse time of $SiCl_4$ (e.g., 5 sec±10%) is longer than the pulse time of ZTB (e.g., 2 sec±10%). Each gas pulse is supplied twice or more (up to 10 times) in some embodiments.

In some embodiments, after the ALD operation, an annealing operation as set forth above is performed to form a $ZrSi_2$ layer as a first coating layer.

FIGS. 17A-17C and 18A-18C show various view of manufacturing a pellicle according to embodiments of the present disclosure. It is understood that additional operations can be provided before, during, and after the processes shown in FIGS. 17A-17C and 18A-18C and some of the operations described below can be replaced or eliminated, for additional embodiments of the method. The order of the operations/processes may be interchangeable.

Figure 17A:
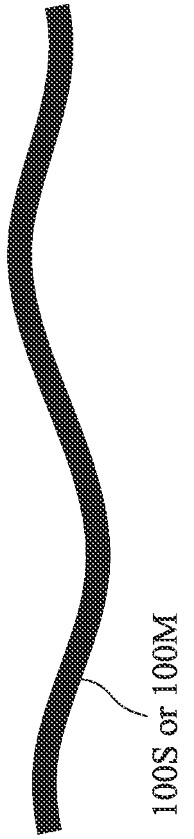
FIGS. 17A, 17B and 17C show various views of manufacturing a pellicle in accordance with an embodiment of the present disclosure.
Figure 17B:
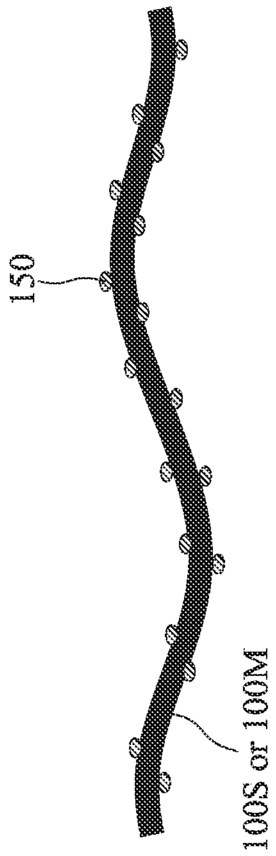
Figure 17C:
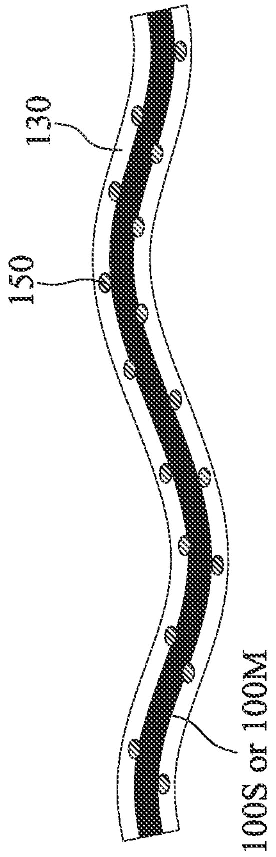

In some embodiments, after the nanotube membrane is formed as shown in FIG. 17A (only one nanotube is shown), a plurality of nano-particles (nano-grains) 150 are disposed over the nanotube 100S or 100M as shown in FIG. 17B. In some embodiments, the plurality of nano-particles include at least one selected from the group consisting of $Mo_2C$, MOC, MON, Ru and $RuO_2$. After the nano-particles 150 are formed, the first coating layer 130 is formed as shown in FIG. 17C. In some embodiments, the nano-particles 150 function as a nucleation seed for the first coating layer 130. In some embodiments, the first coating layer 130 fully covers the plurality of nano-particles 150. In other embodiments, one or more nano-particles 150 are exposed from the first coating layer 130.

Figure 18A:
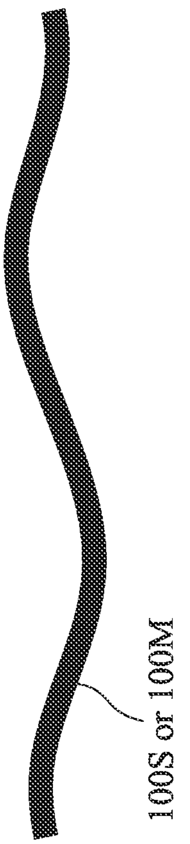
FIGS. 18A, 18B and 18C show various views of manufacturing a pellicle in accordance with an embodiment of the present disclosure.
Figure 18B:
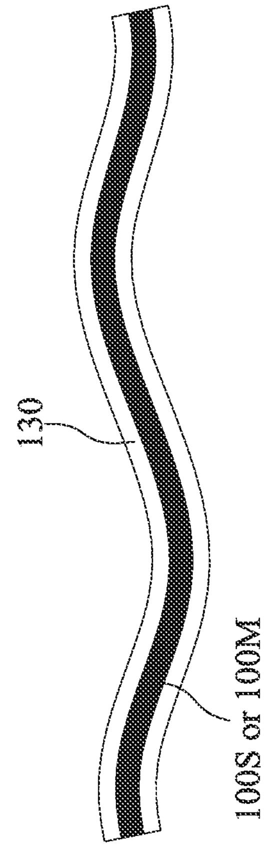
Figure 18C:
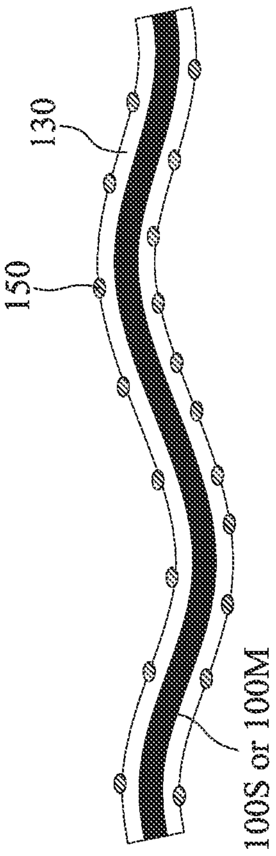

In other embodiments, as shown in FIGS. 18A-18C, after the first coating layer 130 is formed over the nanotube, the plurality of nano-particles 150 are formed over the first coating layer 130. As shown in FIG. 18C, the nano-particles 150 do not contact the nanotube in some embodiments.

In some embodiments, the nano-particles are formed by CVD, PVD or ALD. In some embodiments, a size (e.g., diameter or length) of the nano-particle is in a range from 1 nm to 5 nm. In some embodiments, the nano-particles function as an absorber of hydrogen atoms from hydrogen gas, thereby preventing damage to the CNTs.

Figure 19A:
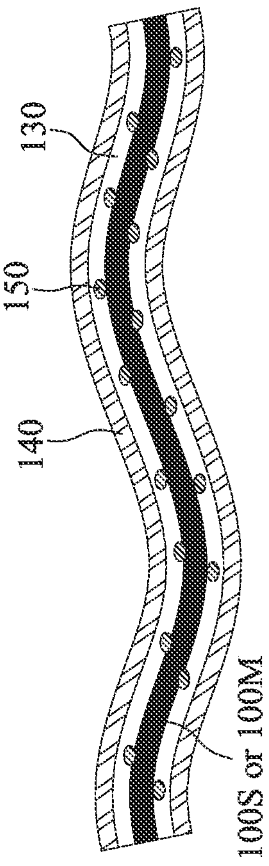
FIGS. 19A and 19B show various views of a nanotube with coating layers in accordance with embodiments of the present disclosure.
Figure 19B:
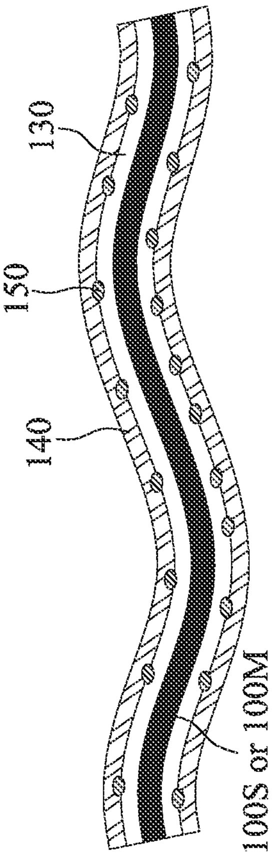

In some embodiments, as shown in FIGS. 19A and 19B, the second coating layer 140 is formed over the first coating layer 130 with the plurality of nano-particles 150. In some embodiments, the second coating layer 140 fully covers the plurality of nano-particles 150. In other embodiments, one or more nano-particles 150 are exposed from the second coating layer 140.

Figure 20B:
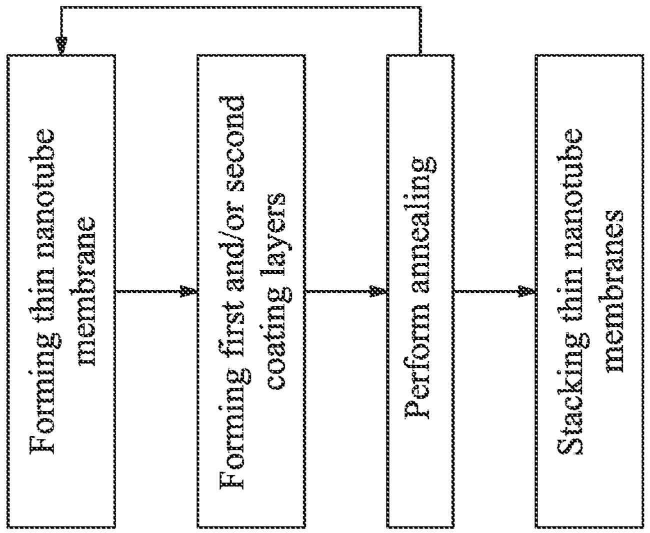
FIGS. 20A and 20B show flow charts for manufacturing a pellicle for an EUV photo mask in accordance with embodiments of the present disclosure.
Figure 20A:
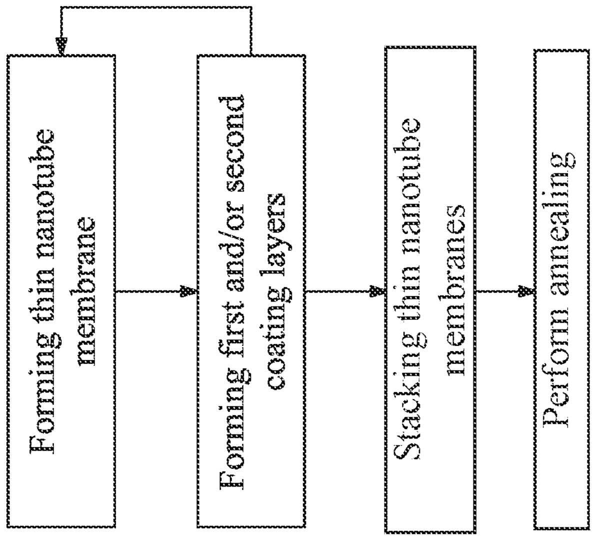

FIGS. 20A and 20B are flow charts showing a method of forming a first coating layer according to embodiments of the present disclosure. It is understood that additional operations can be provided before, during, and after the processes shown in FIGS. 20A and 20B, and some of the operations described below can be replaced or eliminated, for additional embodiments of the method. The order of the operations/processes may be interchangeable.

In some embodiments, a pellicle membrane is formed by stacking two or more thin nanotube membranes. In the flow of FIG. 20A, a thin nanotube membrane is formed. In some embodiments, the thin nanotube membrane includes one or several (2-5) layers of nanotubes. In some embodiments, a dummy frame is attached to the thin nanotube membrane to support the thin membrane. Then, first and/or second coating layers are formed over each of the nanotubes as set forth above. In some embodiments, several (2-10) thin nanotube membranes are stacked to form a nanotube membrane. Then, an annealing operation is performed to form a silicide layer (the first coating layer).

In other embodiments, in the flow of FIG. 20B, the annealing operation is performed for each thin nanotube membranes to form the silicide layer and then the several (2-10) thin nanotube membranes are stacked to form a nanotube membrane.

Figure 21A:
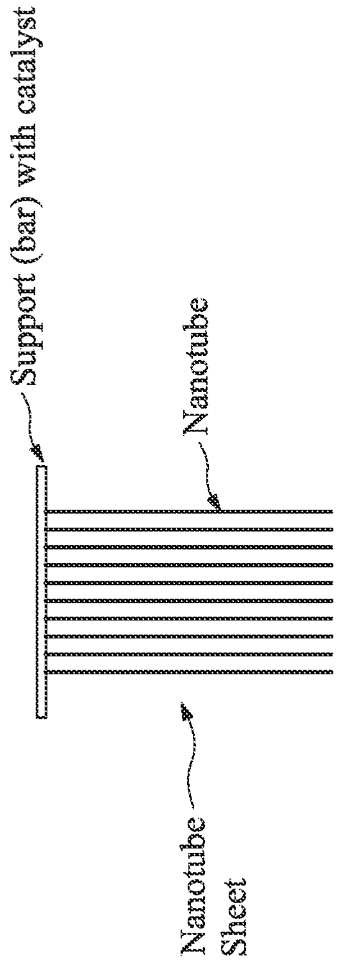
FIGS. 21A, 21B, 21C and 21D show manufacturing of nanotube network membranes for a pellicle in accordance with embodiments of the present disclosure.

FIGS. 21A, 21B, 21C and 21D show the manufacturing of nanotube network membranes for a pellicle in accordance with embodiments of the present disclosure. In some embodiments, a plurality of elongated nanotubes are formed in a vertical furnace from catalysts attached to a support (dummy) frame or a support bar as shown in FIG. 21A. In some embodiments, the vertically formed nanotubes form a freestanding sheet of nanotubes. In some embodiments, the nanotubes are entangled with each other in the sheet. In some embodiments, the length of the nanotube sheet is in a range from about 5 cm to about 50 cm.

Figure 21B:
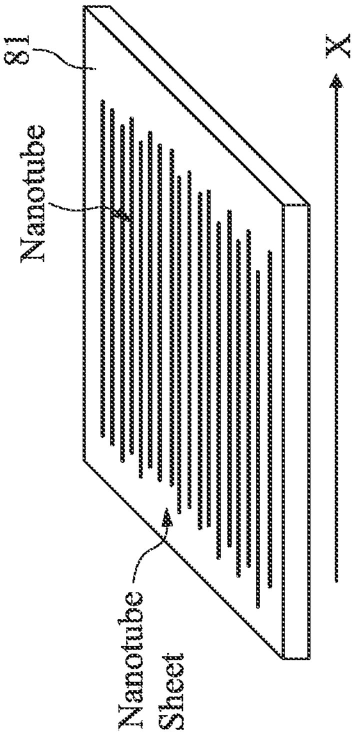

In some embodiments, after the elongated single wall nanotubes is grown from the catalysts on the support frame or bar, one or more outer nanotubes are formed co-axially wrapping around the single wall nanotubes. In some embodiments, the nanotube sheet is placed on a dummy frame 81 as shown in FIG. 21B. In some embodiments, the nanotube sheet supported by the dummy frame is subjected to the coating operation as set forth above. Before or after attaching the nanotube sheet to the dummy frame, the nanotube sheet is cut into a desired size, in some embodiments.

Figure 21C:
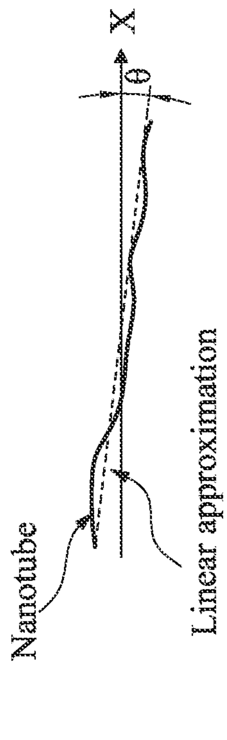

In some embodiments, the nanotubes of the nanotube sheet are substantially aligned with a specific direction, e.g., X direction as shown in FIG. 21B. In some embodiments, more than about 90% of the nanotubes of the nanotube sheet have angles θ of ±15 degrees with respect to the X direction, when each of the nanotubes of the first layer is subjected to linear approximation as shown in FIG. 21C. In some embodiments, the X direction coincides with the average direction of the linear approximated nanotubes. In some embodiments, the coating operation is performed on the nanotube sheet as shown in FIG. 21A.

Figure 21D:
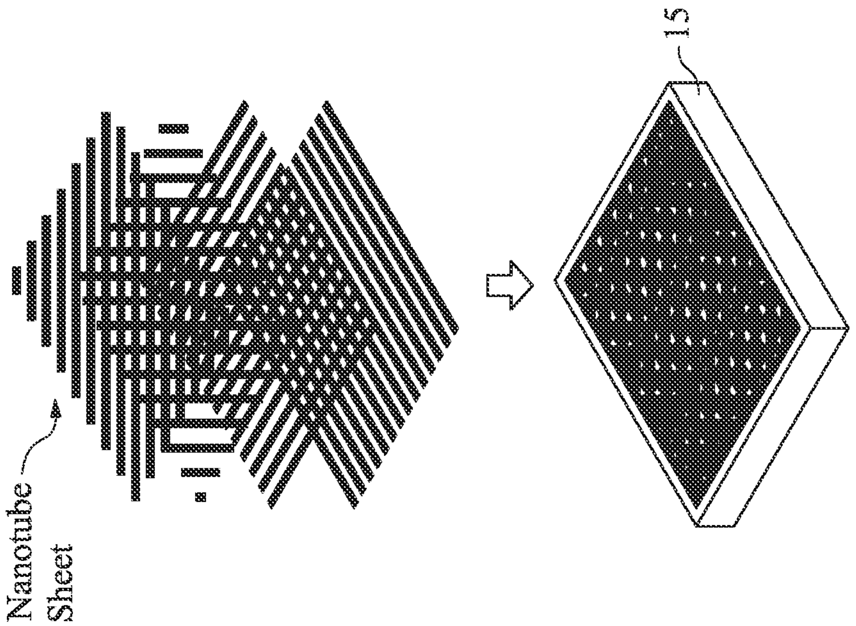

In some embodiments, two or more nanotube sheets having first and/or second coating layers and a desired shape to fit a pellicle frame are stacked and attached to the pellicle frame 15 forming the network membrane, such that the two adjacent layers of the nanotube sheets have different alignment axes (e.g., different orientations), as shown in FIG. 21D. In some embodiments, the alignment axis of one layer and the alignment axis of the adjacent layer form an angle of about 30 degrees to about 90 degrees. In some embodiments, the number N of layers of the nanotube sheets and the angle difference A between adjacent sheets satisfy $N \times A = n \times 180$ degrees, where N is a natural number of two or more and n is a natural number of one or more. In some embodiments, N is up to 10. In some embodiments, after the stack of the nanotube sheets are formed, the stacked sheet is cut into a desired shape to form a network membrane and then the network membrane is attached to the pellicle frame.

In some embodiments, the pellicle of the present embodiments further includes one or more cover layers. The cover layer(s) is attached to the membrane after the first and/or second coating layers are formed over nanotubes of the nanotube membrane.

Figures 22A, 22B, 22C, 22D, 22E:
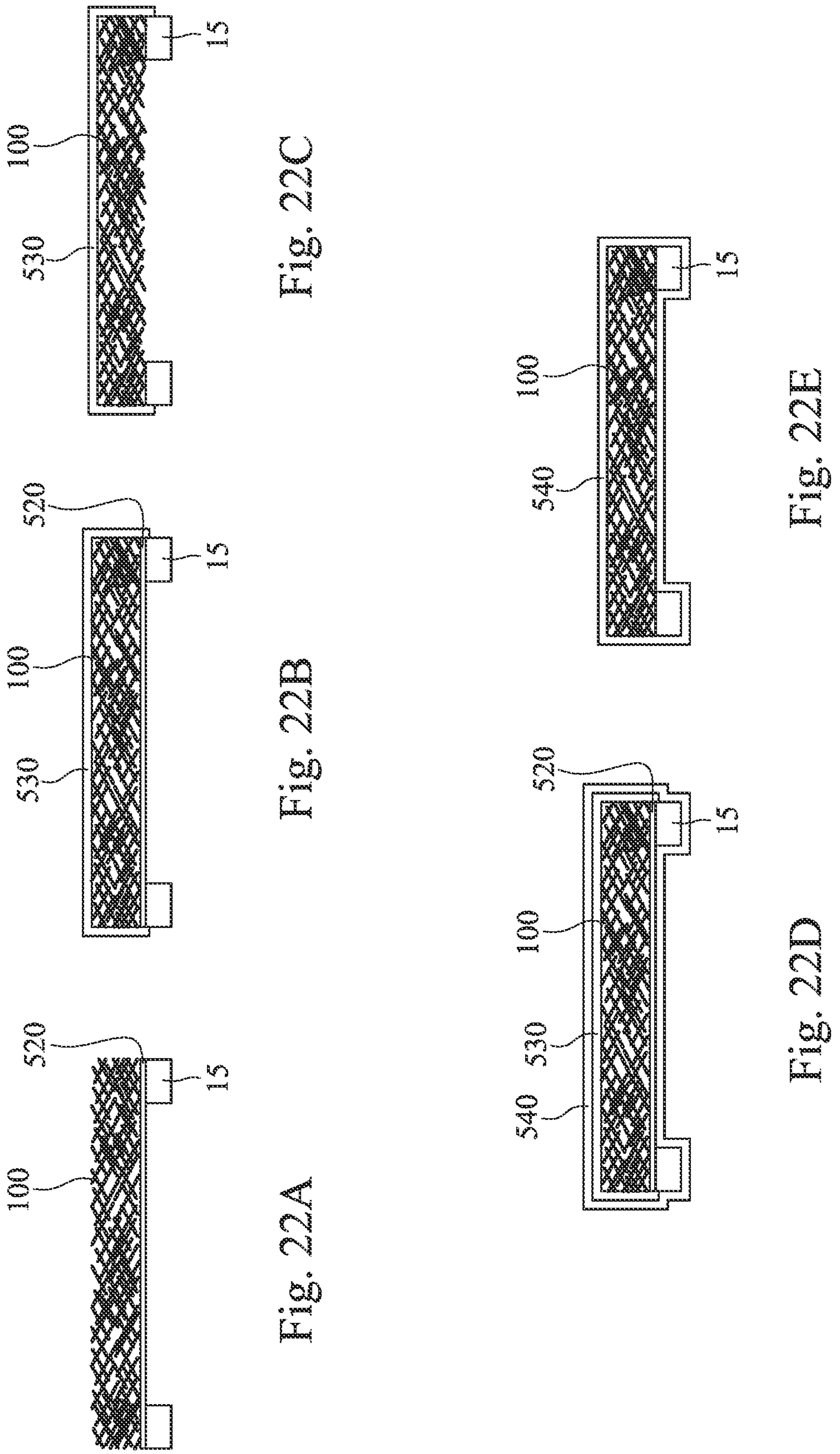
FIGS. 22A, 22B, 22C, 22D and 22E show diagrams of a pellicle in accordance with some embodiments of the present disclosure.

In some embodiments, a first cover sheet (or layer) 520 is formed at the bottom surface of the network membrane 100 between the frame 15 and the network membrane 100 as shown in FIG. 22A. In some embodiments, a second cover sheet 530 is formed over the network membrane 100 to seal the network membrane together with the first cover sheet 520, as shown in FIG. 22B. In some embodiments, no first cover sheet is used and only the second cover sheet 530 is used, as shown in FIG. 22C. In some embodiments, a third cover sheet 540 covers the entire structure of FIG. 22B (or FIG. 22A or 22C), as shown in FIG. 22D. In some embodiment, no first cover sheet and/or second cover sheet are used as shown in FIG. 22E. In some embodiments, the material of the third cover sheet 540 of FIG. 22E is the same as the material of the first and/or second cover sheets.

In some embodiments, one of or both of the first cover layer 520 and the second cover layer 530 include a two-dimensional material in which one or more two-dimensional layers are stacked. Here, a "two-dimensional" layer refers to one or a few crystalline layers of an atomic matrix or a network having thickness within the range of about 0.1-5 nm, in some embodiments. In some embodiments, the two-dimensional materials of the first cover layer 520 and the second cover layer 530 are the same or different from each other. In some embodiments, the first cover layer 520 includes a first two-dimensional material and the second cover layer 530 includes a second two-dimensional material.

In some embodiments, the two-dimensional material for the first cover layer 520 and/or the second cover layer 530 includes at least one of boron nitride (BN), graphene, and/or transition metal dichalcogenides (TMDs), represented by MX2, where M=Mo, W, Pd, Pt, and/or Hf, and X═S, Se and/or Te. In some embodiments, a TMD is one of $MoS_2$, $MoSe_2$, $WS_2$ or $WSe_2$.

In some embodiments, a total thickness of each of the first cover layer 520 and the second cover layer 530 is in a range from about 0.3 nm to about 3 nm and is in a range from about 0.5 nm to about 1.5 nm in other embodiments. In some embodiments, a number of the two-dimensional layers of each of the two-dimensional materials of the first and/or second cover layers is 1 to about 20, and is 2 to about 10 in other embodiments. When the thickness and/or the number of layers is greater than these ranges, EUV transmittance of the pellicle may be decreased and when the thickness and/or the number of layers is smaller than these ranges, mechanical strength of the pellicle may be insufficient.

In some embodiments, a third cover layer 540 includes at least one layer of an oxide, such as $HfO_2$, $Al_2O_3$, $ZrO_2$, $Y_2O_3$, or $La_2O_3$. In some embodiments, the third cover layer 540 includes at least one layer of non-oxide compounds, such as $B_4C$, YN, $Si_3N_4$, BN, NbN, RuNb, $YF_3$, TiN, or ZrN. In some embodiments, the third cover layer 540 includes at least one metal layer made of, for example, Ru, Nb, Y, Sc, Ni, Mo, W, Pt, or Bi. In some embodiments, the third cover layer 540 is a single layer, and in other embodiments, two or more layers of these materials are used as the third cover layer 540. In some embodiments, a thickness of the third cover layer is in a range from about 0.1 nm to about 5 nm, and is in a range from about 0.2 nm to about 2.0 nm in other embodiments. When the thickness of the third cover layer 540 is greater than these ranges, EUV transmittance of the pellicle may be decreased and when the thickness of the third cover layer 540 is smaller than these ranges, the mechanical strength of the pellicle may be insufficient.

In some embodiments, the thickness of the network membrane 100 is in a range from about 5 nm to about 100 nm, and is in a range from about 10 nm to about 50 nm in other embodiments. When the thickness of the network membrane 100 is greater than these ranges, EUV transmittance may be decreased and when the thickness of the network membrane 100 is smaller than these ranges, the mechanical strength may be insufficient.

Figure 23A:
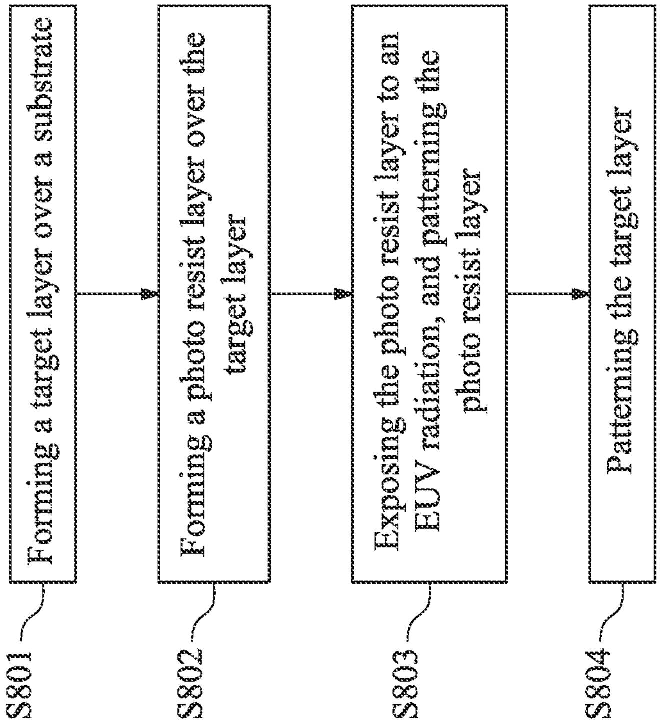
FIG. 23A shows a flowchart of a method making a semiconductor device.
Figure 23B:
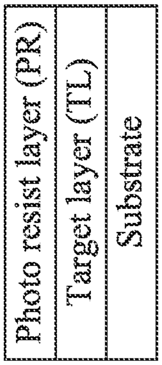
FIGS. 23B, 23C, 23D and 23E show a sequential manufacturing operation of a method of making a semiconductor device in accordance with embodiments of present disclosure.
Figure 23C:
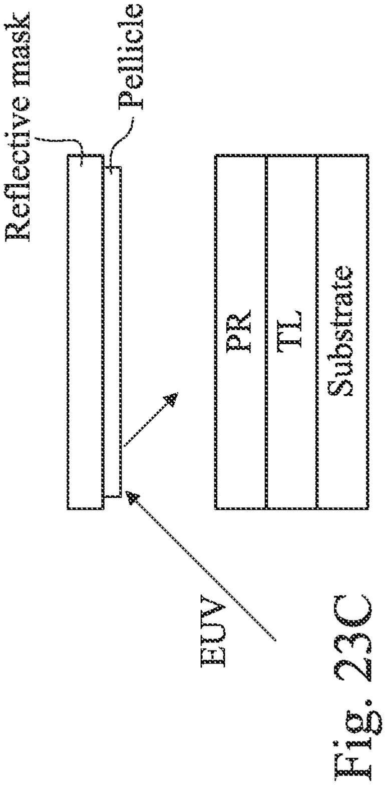

FIG. 23A shows a flowchart of a method of making a semiconductor device, and FIGS. 23B, 23C, 23D and 23E show a sequential manufacturing method of making a semiconductor device in accordance with embodiments of the present disclosure. A semiconductor substrate or other suitable substrate to be patterned to form an integrated circuit thereon is provided. In some embodiments, the semiconductor substrate includes silicon. Alternatively or additionally, the semiconductor substrate includes germanium, silicon germanium or other suitable semiconductor material, such as a Group III-V semiconductor material. At S801 of FIG. 23A, a target layer to be patterned is formed over the semiconductor substrate. In certain embodiments, the target layer is the semiconductor substrate. In some embodiments, the target layer includes a conductive layer, such as a metallic layer or a polysilicon layer; a dielectric layer, such as silicon oxide, silicon nitride, SiON, SiOC, SiOCN, SiCN, hafnium oxide, or aluminum oxide; or a semiconductor layer, such as an epitaxially formed semiconductor layer. In some embodiments, the target layer is formed over an underlying structure, such as isolation structures, transistors or wirings. At S802, of FIG. 23A, a photo resist layer is formed over the target layer, as shown in FIG. 23B. The photo resist layer is sensitive to the radiation from the exposing source during a subsequent photolithography exposing process. In the present embodiment, the photo resist layer is sensitive to EUV light used in the photolithography exposing process. The photo resist layer may be formed over the target layer by spin-on coating or other suitable technique. The coated photo resist layer may be further baked to drive out solvent in the photo resist layer. At S803 of FIG. 23A, the photo resist layer is patterned using an EUV reflective mask with a pellicle as set forth above, as shown in FIG. 23C. The patterning of the photo resist layer includes performing a photolithography exposing process by an EUV exposing system using the EUV mask. During the exposing process, the integrated circuit (IC) design pattern defined on the EUV mask is imaged to the photo resist layer to form a latent pattern thereon. The patterning of the photo resist layer further includes developing the exposed photo resist layer to form a patterned photo resist layer having one or more openings. In one embodiment where the photo resist layer is a positive tone photo resist layer, the exposed portions of the photo resist layer are removed during the developing process. The patterning of the photo resist layer may further include other process steps, such as various baking steps at different stages. For example, a post-exposure-baking (PEB) process may be implemented after the photolithography exposing process and before the developing process.

Figure 23D:
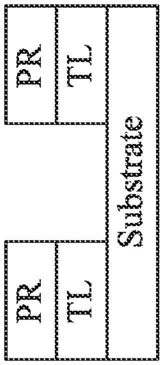
Figure 23E:
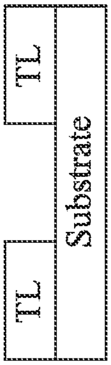

At S804 of FIG. 23A, the target layer is patterned utilizing the patterned photo resist layer as an etching mask, as shown in FIG. 23D. In some embodiments, the patterning the target layer includes applying an etching process to the target layer using the patterned photo resist layer as an etch mask. The portions of the target layer exposed within the openings of the patterned photo resist layer are etched while the remaining portions are protected from etching. Further, the patterned photo resist layer may be removed by wet stripping or plasma ashing, as shown in FIG. 23E.

In some embodiments, the network membrane including carbon nanotubes, on which one or more coating layers are formed is used for an EUV transmissive window, a debris catcher disposed between an EUV lithography apparatus and an EUV radiation source, or any other parts in an EUV lithography apparatus where a high EUV transmittance is required.

In the foregoing embodiments, a pellicle membrane include nanotubes (e.g., CNTs), on the surface of each of which one or more coating layers are formed. The pellicles according to embodiments of the present disclosure provide higher strength as well as higher EUV transmittance than conventional pellicles.

It will be understood that not all advantages have been necessarily discussed herein, no particular advantage is required for all embodiments or examples, and other embodiments or examples may offer different advantages.

In accordance with one aspect of the present disclosure, a pellicle for an extreme ultraviolet (EUV) photomask includes a pellicle frame and a main membrane attached to the pellicle frame. The main membrane includes a plurality of nanotubes, and each of the plurality of nanotubes is covered by a coating layer containing Si and one or more metal elements. In one or more of the foregoing and following embodiments, the coating layer is made of silicide. In one or more of the foregoing and following embodiments, the one or more metal elements are transition metal. In one or more of the foregoing and following embodiments, the transition metal includes Zr, Ti, Mn, Fe, Ru, Ni, Pd, Co, Mo, Nb, Ir or Rh. In one or more of the foregoing and following embodiments, the coating layer is made of silicide containing nitrogen. In one or more of the foregoing and following embodiments, the one or more metal elements are transition metal. In one or more of the foregoing and following embodiments, the transition metal includes Zr, Ti, Mn, Fe, Ru, Ni, Pd, Co, Mo, Nb, Jr or Rh. In one or more of the foregoing and following embodiments, the plurality of nanotubes includes single wall carbon nanotubes. In one or more of the foregoing and following embodiments, the plurality of nanotubes includes multi wall nanotubes. In one or more of the foregoing and following embodiments, the plurality of nanotubes includes multi wall carbon nanotubes. In one or more of the foregoing and following embodiments, a thickness of the coating layer is in a range from 2 nm to 20 nm.

In accordance with another aspect of the present disclosure, a pellicle for an extreme ultraviolet (EUV) reflective mask includes a pellicle frame and a main membrane attached to the pellicle frame. The main membrane includes a plurality of nanotubes, and each of the plurality of nanotubes is covered by a first coating layer made of silicide or silicide-nitride and a second coating layer disposed over the first coating layer. In one or more of the foregoing and following embodiments, the second coating layer has a lower oxidation rate than the first coating layer. In one or more of the foregoing and following embodiments, the second coating layer includes one of AlN, TiN or SiC. In one or more of the foregoing and following embodiments, the first coating layer includes one or more of Zr, Ti, Mn, Fe, Ru, Ni, Pd, Co, Mo, Nb, Jr or Rh. In one or more of the foregoing and following embodiments, a thickness of the first coating layer is in a range from 2 nm to 20 nm. In one or more of the foregoing and following embodiments, a thickness of the second coating layer is in a range from 2 nm to 10 nm. In one or more of the foregoing and following embodiments, a thickness of the second coating layer is not uniform. In one or more of the foregoing and following embodiments, the plurality of nanotubes includes single wall carbon nanotubes. In one or more of the foregoing and following embodiments, the plurality of nanotubes includes multi wall carbon nanotubes.

In accordance with another aspect of the present disclosure, a pellicle for an extreme ultraviolet (EUV) reflective mask includes a pellicle frame and a main membrane attached to the pellicle frame. The main membrane includes a plurality of nanotubes, each of the plurality of nanotubes is covered by a first coating layer made of silicide or silicide-nitride, and a nano-particle is disposed on the plurality of nanotubes or over the first coating layer. In one or more of the foregoing and following embodiments, the nano-particle includes at least one selected from the group consisting of $Mo_2C$, MoC, MoN, Ru and $RuO_2$. In one or more of the foregoing and following embodiments, a size of the nano-particle is in a range from 1 nm to 5 nm. In one or more of the foregoing and following embodiments, a second coating layer is disposed over the first coating layer. In one or more of the foregoing and following embodiments, the second coating layer includes one of AlN, TiN or SiC. In one or more of the foregoing and following embodiments, the first coating layer includes one or more of ZrSi, MoSi, NbSi, ZrSiN, MoSiN or NbSiN. In one or more of the foregoing and following embodiments, the plurality of nanotubes include a co-axial nanotube having an inner tube and one or more outer tubes, and the inner tube is a carbon nanotube. In one or more of the foregoing and following embodiments, the plurality of nanotubes include a co-axial nanotube having an inner tube and one or more outer tubes made of a different material than the inner tube. In one or more of the foregoing and following embodiments, the plurality of nanotubes include a co-axial nanotube having an inner tube and one or more outer tubes, all of which are made of different materials from each other. In one or more of the foregoing and following embodiments, the plurality of nanotubes include a co-axial nanotube having an inner tube and one or more outer tubes, all of which are the non-carbon based nanotube. In one or more of the foregoing and following embodiments, the main membrane comprises a mesh formed by the plurality of nanotubes. In one or more of the foregoing and following embodiments, the main membrane includes voids each having an area of 10 $nm^2$ to 1000 $nm^2$.

In accordance with another aspect of the present disclosure, in a method of manufacturing a pellicle for an extreme ultraviolet (EUV) reflective mask, a nanotube layer including a plurality of nanotubes is formed, and a first coating layer made of silicide or a silicide-nitride is formed over each of the plurality of nanotubes. In one or more of the foregoing and following embodiments, when the first coating layer is formed, a metal containing layer is formed over the plurality of nanotubes, a silicon containing layer is formed over the metal containing layer, and a heating operation is performed to form an alloy of a metal containing in the metal containing layer and silicon in the silicon containing layer. In one or more of the foregoing and following embodiments, the heating operation is performed at a temperature in a range from 200° C. to 1000° C. In one or more of the foregoing and following embodiments, the heating operation is performed for 5 min to 60 min. In one or more of the foregoing and following embodiments, the metal containing layer and the silicon containing layer are formed by chemical vapor deposition (CVD) or atomic layer deposition (ALD), respectively. In one or more of the foregoing and following embodiments, the heating operation is performed by applying a current to the nanotube layer. In one or more of the foregoing and following embodiments, the heating operation is performed under a pressure in a range from $10^{-2}$ Torr to $10^{-7}$ Torr. In one or more of the foregoing and following embodiments, the heating operation is performed in an $N_2$, $NH_3$, He, or Ar ambient without oxidizing gas. In one or more of the foregoing and following embodiments, a second coating layer is formed over the first coating layer. In one or more of the foregoing and following embodiments, the second coating layer includes one of AlN, TiN or SiC. In one or more of the foregoing and following embodiments, the first coating layer includes silicide or silicide nitride of one or more of Zr, Ti, Mn, Fe, Ru, Ni, Pd, Co, Mo, Nb, Jr or Rh.

In accordance with another aspect of the present disclosure, in a method of manufacturing a pellicle for an extreme ultraviolet (EUV) reflective mask, a nanotube layer including a plurality of nanotubes is formed, and a coating layer containing Si and one or more transition metals is formed over the plurality of nanotubes by atomic layer deposition (ALD). In one or more of the foregoing and following embodiments, the ALD comprises supplying a Zr containing precursor and supplying a Si containing precursor. In one or more of the foregoing and following embodiments, the Zr containing precursor is zirconium tetra-tert-butoxide ($Zr[OC(CH_3)_3]_4$) and the Si containing precursor is $SiCl_4$. In one or more of the foregoing and following embodiments, the Zr containing precursor is $ZrCl_4$ and the Si containing precursor is tetra butyl orthosilicate. In one or more of the foregoing and following embodiments, a deposition temperature of the ALD is in a range from 100° C. to 500° C. In one or more of the foregoing and following embodiments, the ALD is performed under a pressure in a range from $10^{-2}$ Torr to $10^{-7}$ Torr. In one or more of the foregoing and following embodiments, in the ALD, each of the Zr precursor and the Si precursor is supplied as a gas pulse of 0.01 sec to 5 sec. In one or more of the foregoing and following embodiments, a heating operation is performed to form an alloy of Si and the one or more transition metal.

In accordance with another aspect of the present disclosure, in a method of manufacturing a pellicle for an extreme ultraviolet (EUV) reflective mask, a nanotube layer including a plurality of nanotubes is formed, a plurality of nano-particles are formed over the plurality of nanotubes, and a first coating layer made of silicide or a silicide-nitride is formed over the plurality of nanotubes. In one or more of the foregoing and following embodiments, the plurality of nano-particles are formed after the first coating layer is formed. In one or more of the foregoing and following embodiments, the plurality of nano-particles include at least one selected from the group consisting of $Mo_2C$, MoC, MoN, Ru and $RuO_2$. In one or more of the foregoing and following embodiments, a size of the plurality of nano-particles is in a range from 1 nm to 5 nm. In one or more of the foregoing and following embodiments, a second coating layer is formed over the first coating layer. In one or more of the foregoing and following embodiments, the second coating layer includes one of AlN, TiN or SiC. In one or more of the foregoing and following embodiments, the first coating layer includes silicide or silicide nitride of one or more of Zr, Ti, Mn, Fe, Ru, Ni, Pd, Co, Mo, Nb, Jr or Rh.

In accordance with another aspect of the present disclosure, in a method of manufacturing a pellicle for an extreme ultraviolet (EUV) reflective mask, a plurality of nanotube sheets, each including a plurality of nanotubes, are formed. Each of the plurality of nanotubes has a first coating layer. The plurality of nanotube sheets are stacked over a pellicle frame. In one or more of the foregoing and following embodiments, the first coating layer includes silicide or silicide nitride of one or more of Zr, Ti, Mn, Fe, Ru, Ni, Pd, Co, Mo, Nb, Jr or Rh. In one or more of the foregoing and following embodiments, a second coating layer is formed over the first coating layer. In one or more of the foregoing and following embodiments, the second coating layer includes one of AlN, TiN or SiC. In one or more of the foregoing and following embodiments, the plurality of nanotubes of one nanotube sheet are arranged along a first axis and the plurality of nanotubes of another nanotube sheet attached to the one nanotube sheet are arranged along a second axis, and the one nanotube sheet and the another nanotube sheet are stacked so that the first axis crosses the second axis. In one or more of the foregoing and following embodiments, more than 90% of the plurality of nanotubes of the one nanotube sheet have angles of ±15 degrees with respect to the first axis, when each of the plurality of nanotubes of the one nanotube sheet is subjected to linear approximation, and more than 90% of the plurality of nanotubes of the another nanotube sheet have angles of ±15 degrees with respect to the second axis, when each of the plurality of nanotubes of the another nanotube sheet is subjected to linear approximation. In one or more of the foregoing and following embodiments, the first axis and the second axis form an angle of 30 degrees to 90 degrees.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A pellicle for an extreme ultraviolet (EUV) reflective mask, comprising:

a pellicle frame; and a main membrane attached to the pellicle frame, wherein:

the main membrane includes a plurality of nanotubes, each of the plurality of nanotubes is covered by a first coating layer containing a transition metal silicide and a second coating layer disposed over the first coating layer, and the second coating layer includes one of AlN, TiN or SiC.

2. The pellicle of claim 1, wherein the transition metal includes Zr, Ti, Mn, Fe, Ru, Ni, Pd, Co, Mo, Nb, Ir or Rh.

3. The pellicle of claim 1, wherein the transition metal silicide further contains nitrogen.

4. The pellicle of claim 1, wherein the plurality of nanotubes includes single wall carbon nanotubes.

5. The pellicle of claim 1, wherein the plurality of nanotubes includes multi wall nanotubes.

6. The pellicle of claim 5, wherein the plurality of nanotubes includes multi wall carbon nanotubes.

7. The pellicle of claim 1, wherein a thickness of the first coating layer is in a range from 2 nm to 20 nm.

8. The pellicle of claim 1, wherein the transition metal includes at least one of Ti, Co, Nb, or Mo.

9. A pellicle for an extreme ultraviolet (EUV) reflective mask, comprising:

a pellicle frame; and a main membrane attached to the pellicle frame, wherein:

the main membrane includes a plurality of nanotubes, and each of the plurality of nanotubes is covered by a first coating layer made of a transition metal silicide or a transition metal silicide-nitride and a second coating layer disposed over the first coating layer.

10. The pellicle of claim 9, wherein the second coating layer has a lower oxidation rate than the first coating layer.

11. The pellicle of claim 10, wherein the second coating layer includes one of AlN, TiN or SiC.

12. The pellicle of claim 9, wherein the transition metal includes one or more of Zr, Ti, Mn, Fe, Ru, Ni, Pd, Co, Mo, Nb, Ir or Rh.

13. The pellicle of claim 9, wherein a thickness of the first coating layer is in a range from 2 nm to 20 nm.

14. The pellicle of claim 9, wherein a thickness of the second coating layer is in a range from 2 nm to 10 nm.

15. The pellicle of claim 9, wherein the transition metal includes at least one of Ti, Co, Nb, or Mo.

16. The pellicle of claim 9, wherein the plurality of nanotubes includes single wall carbon nanotubes.

17. The pellicle of claim 9, wherein the plurality of nanotubes includes multi wall carbon nanotubes.

18. A method of manufacturing a semiconductor device, comprising:

forming a photo resist layer over a target layer;

exposing the photo resist layer to an EUV radiation reflected by a photo mask with a pellicle; and developing the exposed photo resist layer to form a resist pattern, wherein the pellicle includes:

a pellicle frame; and a main membrane attached to the pellicle frame, the main membrane includes a plurality of nanotubes, and each of the plurality of nanotubes is covered by a first coating layer containing a transition metal silicide or a transition metal silicide-nitride and a second coating layer disposed over the first coating layer.

19. The method of claim 18, wherein the transition metal includes Zr, Ti, Mn, Fe, Ru, Ni, Pd, Co, Mo, Nb, Ir or Rh.

20. The method of claim 19, wherein the transition metal includes at least one of Ti, Co, Nb, or Mo.

* * * * *